United States Patent
Huemoeller et al.

(10) Patent No.: US 8,017,436 B1
(45) Date of Patent: Sep. 13, 2011

(54) THIN SUBSTRATE FABRICATION METHOD AND STRUCTURE

(75) Inventors: Ronald Patrick Huemoeller, Chandler, AZ (US); Sukianto Rusli, Phoenix, AZ (US); Bob Shih-Wei Kuo, Chandler, AZ (US); Jon Gregory Aday, Chandler, AZ (US); Lee John Smith, Chandler, AZ (US); Robert F. Darveaux, Higley, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 177 days.

(21) Appl. No.: 11/953,680

(22) Filed: Dec. 10, 2007

(51) Int. Cl.
  *H01L 23/48* (2006.01)
  *H01L 23/52* (2006.01)
  *H05K 1/16* (2006.01)

(52) U.S. Cl. ............. 438/107; 438/15; 438/25; 438/51; 257/701; 257/E21.499

(58) Field of Classification Search .......... 438/15, 438/25–26, 51–55, FOR. 337
See application file for complete search history.

(56) References Cited

U.S. PATENT DOCUMENTS

| | | | |
|---|---|---|---|
| 3,324,014 A * | 6/1967 | Modjeska | 205/122 |
| 6,035,527 A | 3/2000 | Tamm | |
| 6,194,250 B1 | 2/2001 | Melton et al. | |
| 6,730,857 B2 | 5/2004 | Konrad et al. | |
| 6,740,964 B2 | 5/2004 | Sasaki | |
| 6,919,514 B2 * | 7/2005 | Konrad et al. | 174/258 |
| 6,930,256 B1 * | 8/2005 | Huemoeller et al. | 174/260 |
| 6,951,773 B2 | 10/2005 | Ho et al. | |
| 7,211,889 B2 | 5/2007 | Shim | |
| 7,242,081 B1 | 7/2007 | Lee | |
| 7,297,562 B1 | 11/2007 | Huemoeller et al. | 438/15 |
| 7,345,361 B2 | 3/2008 | Mallik et al. | |
| 7,372,151 B1 | 5/2008 | Fan et al. | |
| 7,405,103 B2 | 7/2008 | Chang | |
| 7,429,502 B2 | 9/2008 | Archer, III et al. | |
| 7,462,933 B2 * | 12/2008 | Zhao et al. | 257/713 |
| 2007/0273049 A1 | 11/2007 | Khan et al. | |
| 2007/0290376 A1 | 12/2007 | Zhao et al. | |
| 2008/0230887 A1 | 9/2008 | Sun et al. | |

FOREIGN PATENT DOCUMENTS

JP  2003204011  *  7/2003

OTHER PUBLICATIONS

Berry et al., "Thin Stacked Interposer Package", U.S. Appl. No. 11/865,617, filed Oct. 1, 2007.

(Continued)

*Primary Examiner* — Bradley K Smith
*Assistant Examiner* — Mohammad Choudhry
(74) *Attorney, Agent, or Firm* — Gunnison McKay & Hodgson, L.L.P.; Serge J. Hodgson

(57) ABSTRACT

A method of forming a package includes forming a circuit pattern on a first carrier and embedding the circuit pattern in a dielectric material on a second carrier. The first carrier is removed and a buildup dielectric material is mounted to the dielectric material and the circuit pattern. Laser-ablated artifacts are formed in the buildup dielectric material and filled with an electrically conductive material to form a buildup circuit pattern. The second carrier is patterned into a stiffener, which provides rigidity to the thin package.

23 Claims, 22 Drawing Sheets

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

Kim et al., "Application of Through Mold Via (TMV) as PoP base package", *58th ECTC Proceedings*, May 2008, Lake Buena Vista, FL, 6 pages, IEEE.

Huemoeller et al., U.S. Appl. No. 11/982,637, filed Nov. 1, 2007, entitled "Circuit-on-Foil Process for Manufacturing a Laminated Semiconductor Package Substrate Having Embedded Conductive Patterns".

Rusli et al., "Ultra Thin Package and Fabrication Method", U.S. Appl. No. 12/237,173, filed Sep. 24, 2008.

* cited by examiner

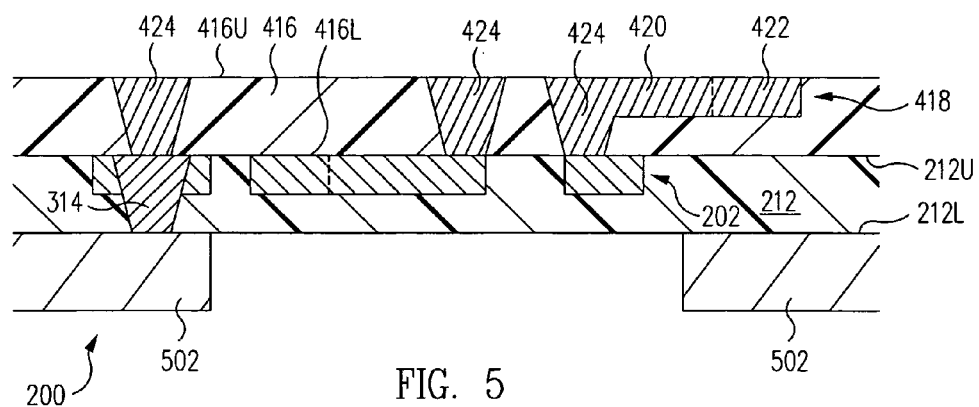
FIG. 5
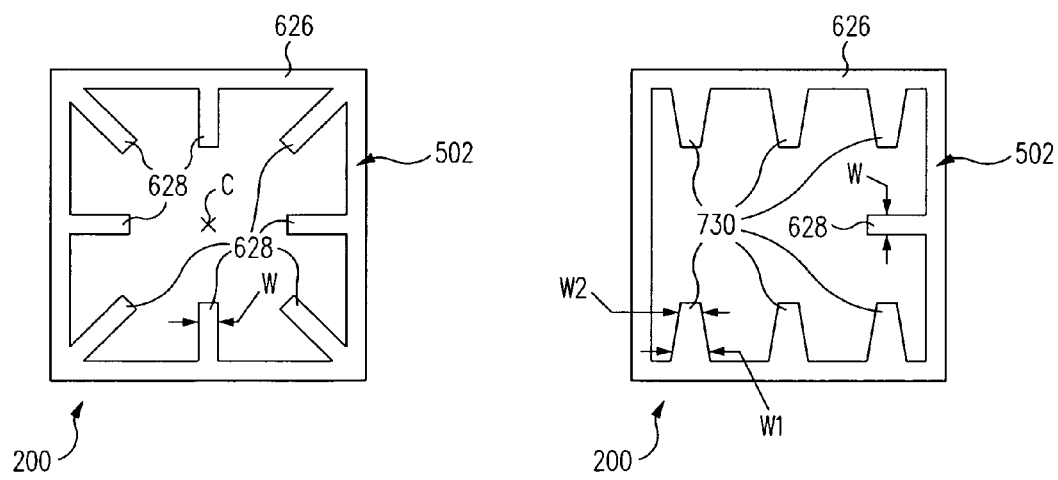
FIG. 6
FIG. 7

_US 8,017,436 B1_

THIN SUBSTRATE FABRICATION METHOD AND STRUCTURE

BACKGROUND OF THE INVENTION

1. Field of the Invention

The present invention relates generally to substrates for mounting of electronic components and the resulting packages. More particularly, the present invention relates to a method of fabricating a thin substrate and the resulting structures.

2. Description of the Related Art

To facilitate formation of a thin electronic component package, the substrate for the electronic component package must also be thin. However, as the substrate becomes increasingly thin, the flexibility of the substrate also undesirability increases. More particularly, a thin substrate is susceptible to bending possibly causing failure of the electronic component package formed with the substrate.

SUMMARY OF THE INVENTION

In accordance with one embodiment, a method of forming a package includes forming a circuit pattern on a first carrier and embedding the circuit pattern in a dielectric material on a second carrier. The first carrier is removed and a buildup dielectric material is mounted to the dielectric material and the circuit pattern. Laser-ablated artifacts are formed in the buildup dielectric material and filled with an electrically conductive material to form a buildup circuit pattern. The second carrier is patterned into a stiffener. As the stiffener is formed from the second carrier, i.e., is built into the package, the package is formed with the stiffener without use of an adhesive to mount the stiffener.

The stiffener stiffens the package, i.e., provides rigidity to the package thus minimizing the flexibility of the package while at the same time maintaining the flatness of the package. Further, the stiffener, the dielectric material, and the buildup dielectric material are thin resulting in a thin rigid package.

These and other features of the present invention will be more readily apparent from the detailed description set forth below taken in conjunction with the accompanying drawings.

BRIEF DESCRIPTION OF THE DRAWINGS

FIGS. 3, 4, and 5 are cross-sectional views of the package of FIG. 2 at various stages during fabrication in accordance with various embodiments of the present invention;

FIG. 6 is a bottom perspective view of the package of FIG. 5 illustrating a stiffener in accordance with one embodiment;

FIG. 7 is a bottom perspective view of the package of FIG. 5 illustrating a stiffener in accordance with another embodiment;

In the following description, the same or similar elements are labeled with the same or similar reference numbers.

DETAILED DESCRIPTION

Figure 1:
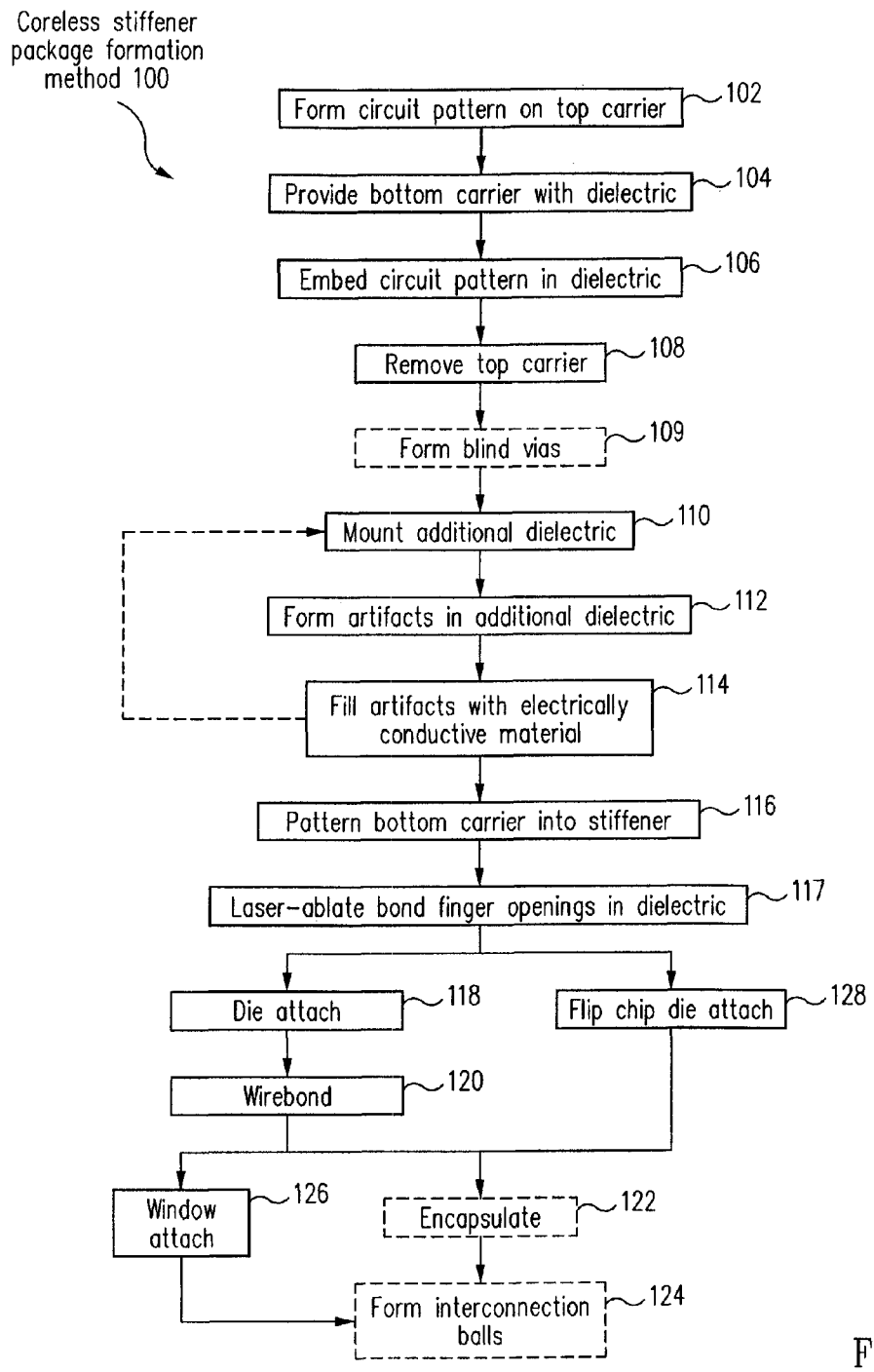
FIG. 1 is a coreless stiffener package formation method in accordance with one embodiment of the present invention.
Figure 2:
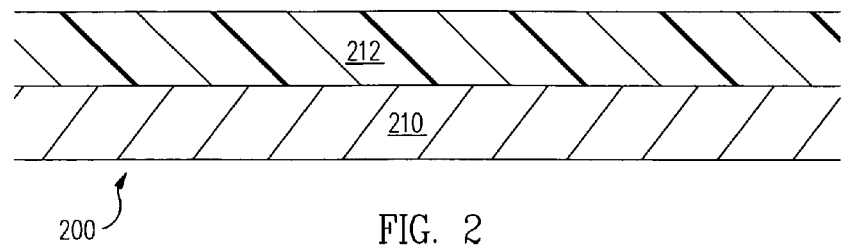
FIG. 2 is a cross-sectional view of a package during fabrication in accordance with one embodiment.
Figure 3:
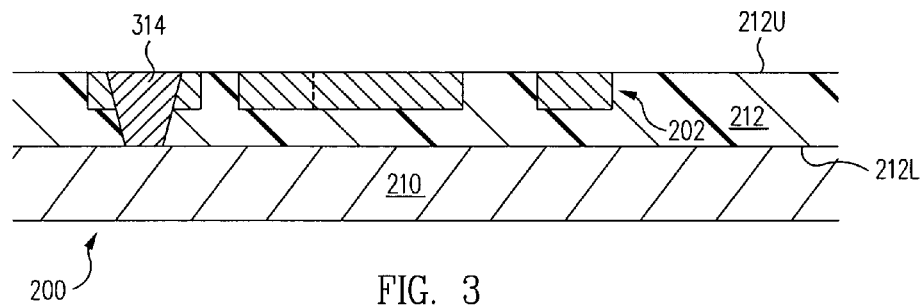
Figure 4:
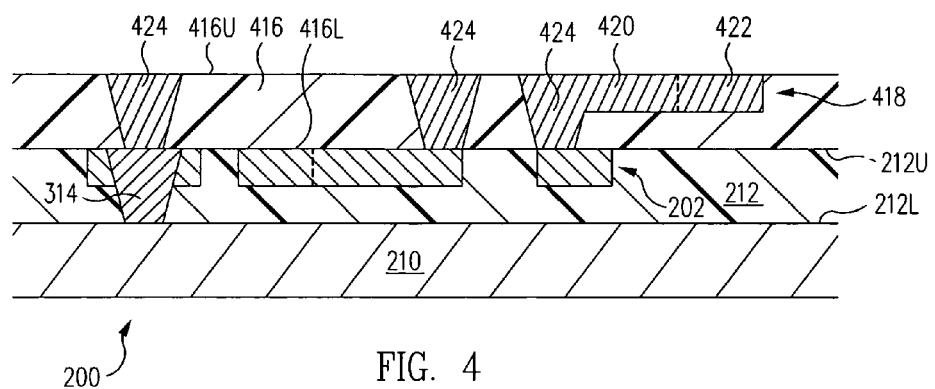

FIG. 1 is a coreless stiffener package formation method 100 in accordance with one embodiment of the present invention. FIG. 2 is a cross-sectional view of a package 200 during fabrication in accordance with one embodiment. FIGS. 3, 4, and 5 are cross-sectional views of package 200 of FIG. 2 at various stages during fabrication in accordance with various embodiments of the present invention.

Referring now to FIGS. 1 and 2 together, in a form circuit pattern on top carrier operation 102, a circuit pattern 202 is formed on a first, e.g., top, carrier 204.

In one embodiment, top carrier 204 is an electrically conductive material, e.g., copper. In other embodiments, carrier 204 (and any of the carriers as discussed herein) are formed of other conductive materials, e.g., copper invar copper, copper aluminum copper, and/or copper alloys. Copper-invar-copper is a sandwich of invar, a high nickel containing iron alloy, between two layers of copper. Copper aluminum copper is a sandwich of aluminum between two layers of copper.

Circuit pattern 202 is formed on top carrier 204 using any one of a number of techniques and the particular technique used is not essential to this embodiment. For example, a photoresist layer is applied to top carrier 204 and patterned to form circuit pattern artifacts therein. These circuit pattern artifacts are filled with one or more electrically conductive materials, e.g., using top carrier 204 as the electroplating electrode, to form circuit pattern 202 and the remaining photoresist layer is stripped. Optionally, a single layer automatic optical inspection (AOI) is performed. Illustratively, circuit pattern 202 includes electrically conductive traces and lands, sometimes called pads.

In one embodiment, circuit pattern 202 is a multilayer conductive structure. For example, as indicated by the horizontal dashed line in FIG. 2, circuit pattern 202 includes a patterned etch stop layer 206 formed directly on top carrier 204 and a patterned conductor layer 208 formed directly on patterned etch stop layer 206. The etch stop metal, e.g., nickel, tin, gold, or palladium, of patterned etch stop layer 206 is selectively etchable compared to the conductor metal, e.g., copper, silver, or solder, of patterned conductor layer 208.

Illustratively, circuit pattern 202 includes a bi-layer structure of nickel and copper, or a tri-layer structure of: (1) nickel, copper and tin; or (2) nickel, copper, and gold.

This facilitates etch removal of top carrier 204 as discussed below in a remove top carrier operation 108. In one embodiment, top carrier 204 is copper and is removed using a copper etch process as the carrier etch process. During this copper etch process, patterned etch stop layer 206 provide an etch stop for the copper etch process.

In one embodiment, an etch stop is an etch process end point. To illustrate, the copper etch process is performed until top carrier 204 is completely removed, which is the process end point. More particularly, upon complete removal of top carrier 204, patterned etch stop layer 206 becomes exposed and prevent further etching during the copper etch process. In this manner, the cross-sectional area of circuit pattern 202 is controlled to very tight tolerance thus maximizing the electrical performance, e.g., high frequency electrical performance, of package 200.

Patterned etch stop layer 206 and patterned conductor layer 208 thus form circuit pattern 202 as an etch stop metal protected circuit pattern on top carrier 204. Stated another way, circuit pattern 202 is a bi-layer structure including patterned etch stop layer 206 and patterned conductor layer 208.

Although circuit pattern 202 is illustrated and discussed above as a bi-layer structure, in another embodiment, circuit pattern 202 is a single layer of conductive material. Except in FIG. 2, circuit pattern 202 is illustrated as a single layer of conductive material for simplicity. However, in light of this disclosure, it is to be understood that circuit pattern 202 can include a multilayer structure such as the bi-layer structure illustrated in FIG. 2.

From form circuit pattern on top carrier operation 102, flow moves to a provide bottom carrier with dielectric operation 104. In provide bottom carrier with dielectric operation 104, a bottom, e.g., second, carrier 210 with a dielectric material 212 is provided.

Bottom carrier 210 is an electrically conductive material, e.g., such as those described above regarding top carrier 204. Bottom carrier 210 acts as a stiffener through coreless stiffener package formation method 100.

Dielectric material 212 is a layer of dielectric, e.g., dielectric tape, dielectric film, adhesive, or other dielectric.

Referring now to FIGS. 1, 2 and 3 together, from provide bottom carrier with dielectric operation 104, flow moves to an embed circuit pattern in dielectric operation 106. In embed circuit pattern in dielectric operation 106, circuit pattern 202 is embedded within dielectric layer 212.

More particularly, as shown in FIG. 3, circuit pattern 202 is embedded into an upper, e.g., first, surface 212U of dielectric material 212. A lower, e.g., second, surface 212L of dielectric material 212 is mounted to bottom carrier 210.

In accordance with one embodiment, circuit pattern 202 is placed on upper surface 212U of dielectric layer 212. The assembly is heated while circuit pattern 202 is pressed into dielectric material 212, sometimes called a dielectric layer.

Due to the heat and pressure, dielectric material 212 is caused to flow around circuit pattern 202 and to top carrier 204. Generally, dielectric material 212 flows to encapsulate circuit pattern 202 within dielectric material 212 such that dielectric material 212 contacts top carrier 204 in the spaces between circuit pattern 202. Dielectric material 212 remains between circuit pattern 202 and bottom carrier 210 thereby electrically isolating circuit pattern 202 and bottom carrier 210 from each other. Stated another way, circuit pattern 202 floats in dielectric material 212.

From embed circuit pattern in dielectric operation 106, flow moves to a remove top carrier operation 108. In remove top carrier operation 108, top carrier 204 is removed, e.g., using a selective etch as discussed above, resulting in the structure as illustrated in FIG. 3.

From remove top carrier operation 108, flow moves, optionally, to a form blind vias operation 109. In form blind vias operation 109, at least one electrically conductive blind via 314 is formed. Blind vias 314 extend through dielectric material 212 between upper surface 212U and lower surface 212L. Blind vias 314 electrically connect circuit pattern 202 to bottom carrier 210 through dielectric material 212.

In one embodiment, to form blind vias 314, via apertures, sometimes called blind via apertures, are formed in dielectric material 212 using laser-ablation. Generally, the via apertures are formed between circuit pattern 202 and bottom carrier 210. The via apertures are filled, e.g., with copper or other conductive material, to form blind vias 314. Optionally, a single layer automatic optical inspection (AOI) is performed.

Referring now to FIGS. 1 and 4 together, from form blind vias operation 109 (or directly from remove top carrier operation 108 if form blind vias operation 109 is not performed), flow moves to a mount additional dielectric operation 110. In mount additional dielectric operation 110, a buildup dielectric material 416, sometimes called a buildup dielectric layer or a coreless buildup layer, is mounted to dielectric material 212 and circuit pattern 202. Generally, buildup dielectric material 416 is mounted to dielectric material 212 and over circuit pattern 202 and blind vias 314.

More particularly, a lower, e.g., first, surface 416L of buildup dielectric material 416 is mounted to upper surface 212U of dielectric material 212. Buildup dielectric material 416 further includes an upper, e.g., second, surface 416U opposite lower surface 416L.

From mount additional dielectric operation 110, flow moves to a form artifacts in additional dielectric operation 112. In form artifacts in additional dielectric operation 112, buildup dielectric material 416 is laser-ablated resulting in the formation of laser-ablated artifacts in buildup dielectric material 416.

The laser-ablated artifacts are formed using a laser-ablation process. During this laser-ablation process, a laser beam is directed at buildup dielectric material 416 and moved. The laser beam laser-ablates at least partially, and in some places through, buildup dielectric material 416. Accordingly, the laser-ablated artifacts are formed at least partially, and in some places through, buildup dielectric material 416. As illustrated in FIG. 4, in one embodiment, the laser-ablated artifacts have a taper profile with the greatest width at upper surface 416U of buildup dielectric material 416 due to the laser-ablation process.

The laser-ablated artifacts include laser-ablated channels, laser-ablated land openings, and/or laser-ablated via apertures. Generally, channels, land openings, and via apertures are particularly shaped laser-ablated voids in buildup dielectric material 416.

In one embodiment, a laser-ablated channel, sometimes called a trench, extends horizontally and in a direction parallel with upper surface 416U of buildup dielectric material 416.

In one embodiment, a laser-ablated land opening is an opening, e.g., a circular, rectangular, or other shaped opening, formed using a repeated, e.g., a trepanning, motion of the laser beam.

In one embodiment, a laser-ablated via opening, sometimes called a laser-ablated via aperture, is an opening (aperture) extending entirely through buildup dielectric material 416 in a direction perpendicular to upper surface 416U of buildup dielectric material 416.

Although various laser-ablated artifacts are discussed above, in light of this disclosure, those of skill in the art will understand that any one of a number of laser-ablated artifacts can be formed.

From form artifacts in additional dielectric operation 112, flow moves to a fill artifacts with electrically conductive material operation 114. In fill artifacts with electrically conductive material operation 114, the laser-ablated artifacts are filled with an electrically conductive filler material, e.g., copper, to form a buildup circuit pattern 418 as illustrated in FIG. 4. Optionally, a single layer automatic optical inspection (AOI) is preformed.

As shown in FIG. 4, buildup circuit pattern 418 is embedded within buildup dielectric material 416. Buildup circuit pattern 418 includes electrically conductive traces, lands, and/or vias. In one embodiment, buildup circuit pattern 418 redistributes the pattern of circuit pattern 202 to the pattern of buildup circuit pattern 418.

In one embodiment, a trace extends horizontally and in a direction parallel with upper surface 416U of buildup dielectric material 416. To illustrate, buildup circuit pattern 418 includes a trace 420. Trace 420 is embedded within upper surface 416U of buildup dielectric material 416 such that buildup dielectric material 416 remains between trace 420 and lower surface 416L of buildup dielectric material 416.

To further illustrate, buildup circuit pattern 418 includes a land 422, sometimes called a pad. Land 422 is embedded within upper surface 416U of buildup dielectric material 416 such that buildup dielectric material 416 remains between land 422 and lower surface 416L of buildup dielectric material 416.

To further illustrate, embedded buildup circuit pattern 418 includes vias 424, sometimes called blind vias. Vias 424 extends between upper surface 416U and lower surface 416L of buildup dielectric material 416. Vias 424 are electrically connected to circuit pattern 202.

Although various features of buildup circuit pattern 418 are illustrated in FIG. 4 and discussed above, in light of this disclosure, those of skill in the art will understand that buildup circuit pattern 418 is formed with any one of a number of electrically conductive features in other embodiments.

As indicated by the dashed arrow in FIG. 1, operations 110, 112, and 114 can be repeated any one of a number of times to form additional buildup circuit patterns in additional buildup dielectric materials.

Referring now to FIGS. 1, 4 and 5 together, from fill artifacts with electrically conductive material operation 114, flow moves to a pattern bottom carrier into stiffener operation 116. In pattern bottom carrier into stiffener operation 116, bottom carrier 210 is patterned into a stiffener 502. In one embodiment, bottom carrier 210 is etched to remove a portion of bottom carrier 210, and the remaining portion of bottom carrier 210 forms stiffener 502. Bottom carrier 210 is patterned using a photoimageable dielectric or resist in one embodiment. As stiffener 502 is formed from bottom carrier 210, i.e., is built into package 200, package 200 is formed with stiffener 502 without use of an adhesive to mount stiffener 502.

Stiffener 502 stiffens package 200, i.e., provides rigidity to package 200 thus minimizing the flexibility of package 200 while at the same time maintaining flatness of package 200. Further, stiffener 502, dielectric material 212, and buildup dielectric material 416 are thin resulting in a thin rigid package 200.

Stiffener 502 can be patterned into a variety of shapes, for example, into the shapes illustrated in FIGS. 6 and 7.

FIG. 6 is a bottom perspective view of package 200 of FIG. 5 illustrating stiffener 502 in accordance with one embodiment. In accordance with this embodiment, stiffener 502 includes a rectangular body 626 around the periphery of package 200. Stiffener 502 further includes a plurality of fingers 628 protruding inwards from body 626 towards a center C of package 200. More particularly, a finger 628 protruding inwards from the middle of each side of rectangular body 626 and from each corner of rectangular body 626 for a total of eight fingers 628. In accordance with this embodiment, each finger 628 extends from rectangular body 626 with a uniform width W.

FIG. 7 is a bottom perspective view of package 200 of FIG. 5 illustrating stiffener 502 in accordance with another embodiment. In accordance with this embodiment, stiffener 502 includes rectangular body 626 around the periphery of package 200. Stiffener 502 further includes a plurality of fingers 628, 730 protruding inwards from body 626.

More particularly, stiffener 502 includes a single finger 628 protruding inwards from the middle of the right side of rectangular body 626. In accordance with this embodiment, finger 628 has uniform width W. Further, three fingers 730 extend inwards from the top side of rectangular body 626 and three fingers 730 extend inwards from the bottom side of rectangular body 626. Fingers 730 are tapered fingers having a first width W1 at rectangular body 626 and tapering to a second smaller width W2. Note that the left side of rectangular body 626 is formed with an absence of fingers.

Although two examples of stiffener 502 are illustrated in FIGS. 6 and 7 and discussed above, in light of this disclosure, those of skill in the art will understand that a stiffener can be patterned in any one of a number of shapes.

Figure 8:
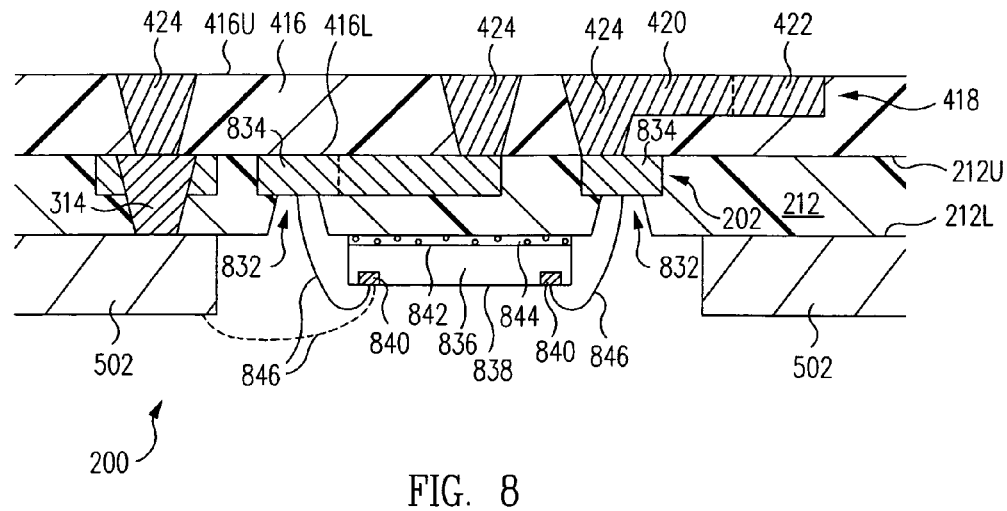
FIGS. 8, 9, and 10 are cross-sectional views of the package of FIG. 5 at various stages during fabrication in accordance with various embodiments of the present invention.
Figure 9:
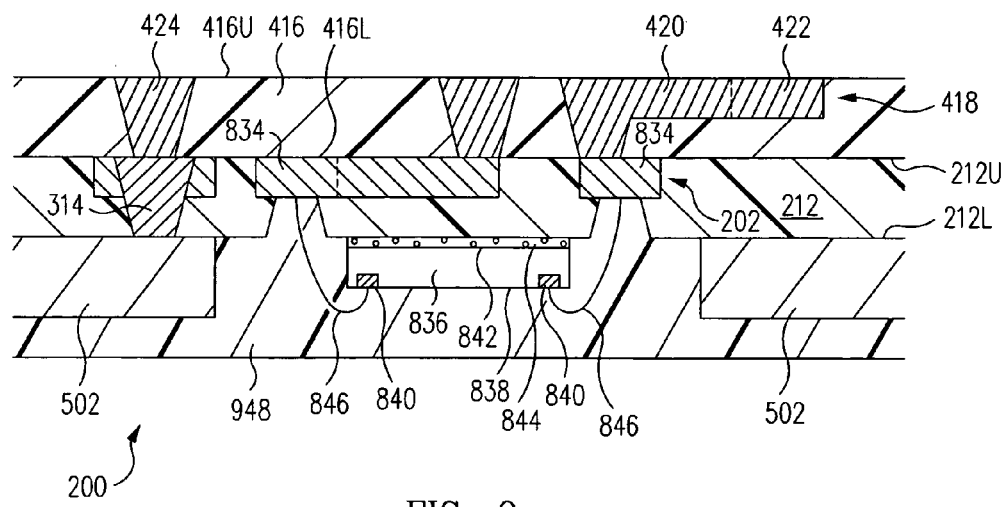
Figure 10:
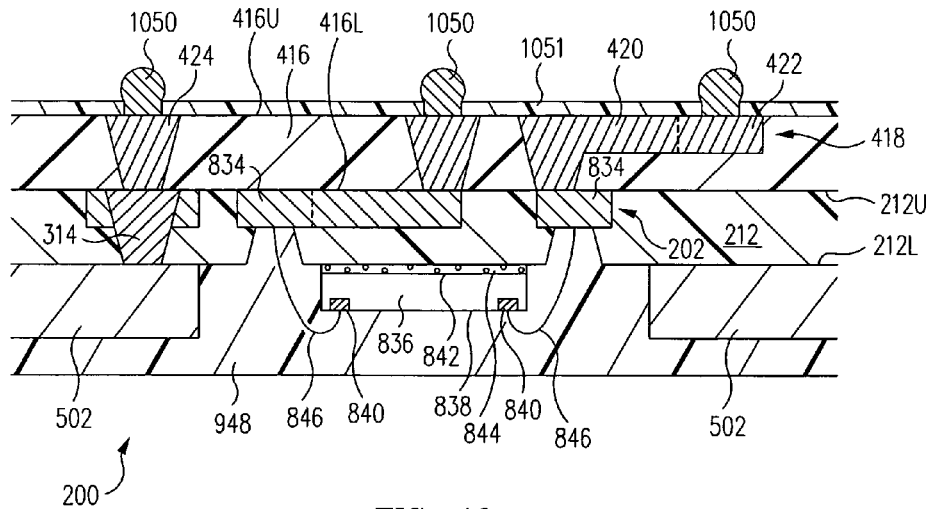

FIGS. 8, 9, and 10 are cross-sectional views of package 200 of FIG. 5 at various stages during fabrication in accordance with various embodiments of the present invention. Referring now to FIGS. 1 and 8 together, from pattern bottom carrier into stiffener operation 116, flow moves to a laser-ablate bond finger openings in dielectric operation 117. In laser-ablate bond finger openings in dielectric operation 117, bond finger openings 832 are formed in dielectric material 212 to expose and define lands 834 of circuit pattern 202. More particularly, bond finger openings 832 extend from lower surface 212L of dielectric material 212 and through dielectric material 212 to expose lands 834 of circuit pattern 202, i.e., portions of circuit pattern 202. Lands 834 are selectively defined (exposed) without use of a soldermask in accordance with this embodiment. Depending upon the material(s) used to form circuit pattern 202, the exposed surface of lands 834 include gold or copper in various embodiments.

From laser-ablate bond finger openings in dielectric operation 117, flow moves to a die attach operation 118. In die attach operation 118, a die 836 is attached to dielectric material 212.

Die 836 is generally an electronic component and in one embodiment is an integrated circuit die. Die 836 includes an active surface 838 having bond pads 840 thereon. Die 836 further includes an inactive surface 842 opposite active surface 838.

In die attach operation 118, inactive surface 842 is attached to lower surface 212L of dielectric material 212 by a die attach adhesive 844.

From die attach operation 118, flow moves to a wirebond operation 120. In wirebond operation 120, bond pads 840 of die 836 are wire bonded (electrically connected) to lands 834 of circuit pattern 202 by bond wires 846. Optionally, in wirebond operation 120, one or more of bond pads 840 of die 836 are wire bonded (electrically connected) to stiffener 502 by bond wires 846 as indicated by the phantom bond wire 846. As discussed above, blind vias 314 are electrically connected to stiffener 502 allowing stiffener 502 to be connected to a reference voltage source, e.g., ground or power, through blind vias 314. Accordingly, one or more bond pads 840 are electrically connected to stiffener 502, which functions as a ground or power ring, i.e., a reference voltage source ring.

Referring now to FIGS. 1 and 9 together, from wirebond operation 120, flow moves, optionally, to an encapsulate operation 122. In encapsulate operation 122, stiffener 502, die 836, bond wires 846, and the exposed portion of lower surface 212L of dielectric material 212 are encapsulated in a package body 948. Illustratively, package body 948 is formed by molding.

Referring now to FIGS. 1 and 10 together, from encapsulate operation 122 (or directly from wirebond operation 120 if encapsulate operation 122 is not performed), flow moves, optionally, to a form interconnection balls operation 124.

In form interconnection balls operation 124, interconnection balls 1050, e.g., solder balls, are formed on buildup circuit pattern 418. More particularly, interconnection balls 1050 are electrically connected to buildup circuit pattern 418. Optionally, a soldermask 1051 is formed on upper surface 416U of buildup dielectric material 416 to define ball grid array (BGA) openings in which interconnection balls 1050 are formed.

Interconnection balls 1050 are used to connect package 200 to a larger substrate, e.g., to a printed circuit motherboard. In one embodiment, interconnection balls 1050 are distributed in an array thus forming a ball grid array (BGA) package. In other embodiments, other types of packages are formed, e.g., a metal land grid array (LGA) type package or a leadless chip carrier (LCC) type package or other type of package and thus form interconnection balls operation 124 is optional.

Figure 11:
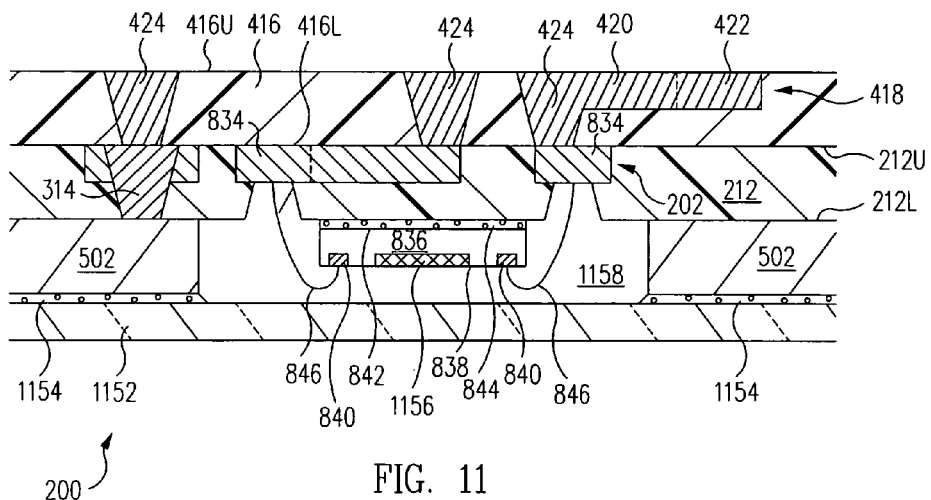
FIG. 11 is a cross-sectional view of the package of FIG. 8 at a further stage during fabrication in accordance with another embodiment.

FIG. 11 is a cross-sectional view of package 200 of FIG. 8 at a further stage during fabrication in accordance with another embodiment. Referring now to FIGS. 1 and 11 together, in an alternative embodiment, from wirebond operation 120, flow moves to a window attach operation 126. In window attach operation 126, a window 1152 is attached to stiffener 502 within an adhesive 1154.

In accordance with this embodiment, die 836 is an image sensor die and includes an active area 1156.

Generally, active area 1156 is responsive to radiation, e.g., electromagnetic radiation, as is well known to those of skill in the art. For example, active area 1156 is responsive to infrared radiation, ultraviolet light, and/or visible light. Illustratively, die 836 is a CMOS image sensor device, a charge coupled device (CCD), a pyroelectric ceramic on CMOS device, or an erasable programmable read-only memory device (EPROM) although other image sensor dies are used in other embodiments.

Window 1152, adhesive 1154, stiffener 502, and dielectric material 212 define a cavity 1158, which is sealed. In particular, active area 1156 is located within cavity 1158, which is sealed to protect active area 1156 against external moisture, dust and contamination.

Window 1152 is transparent to the radiation of interest, e.g., to the radiation to which active area 1156 of die 836 is responsive, as those of skill in the art will understand. In one particular embodiment, window 1152 is optically transparent borosilicate glass.

During use, radiation is directed at package 200. This radiation passes through window 1152 and strikes active area 1156, which responds to the radiation as is well known to those of skill in the art. However, in an alternative embodiment, active area 1156 transmits radiation such as electromagnetic radiation. For example, die 836 is a light emitting diode (LED) micro-display. In accordance with this embodiment, radiation transmitted by active area 1156 passes through window 1152, and emanates from package 200. For simplicity, in the above and following discussions, active area 1156 as a receiver of radiation is set forth. However, in light of this disclosure, those of skill in the art will recognize that generally active area 1156 is a receiver of radiation, a transmitter of radiation, or a transceiver, i.e., a transmitter and a receiver, of radiation.

Although window 1152 is set forth, in other embodiments, window 1152 has optical powers, e.g., is a lens. In another embodiment, a lens is attached to window 1152. In yet another embodiment, an opaque lid having an opening formed therein is used instead of transparent window 1152. A lens is attached over the opening in the opaque lid in one embodiment.

From window attach operation 126, flow moves, optionally, to form interconnection balls operation 124 which is performed as discussed above.

Figure 12:
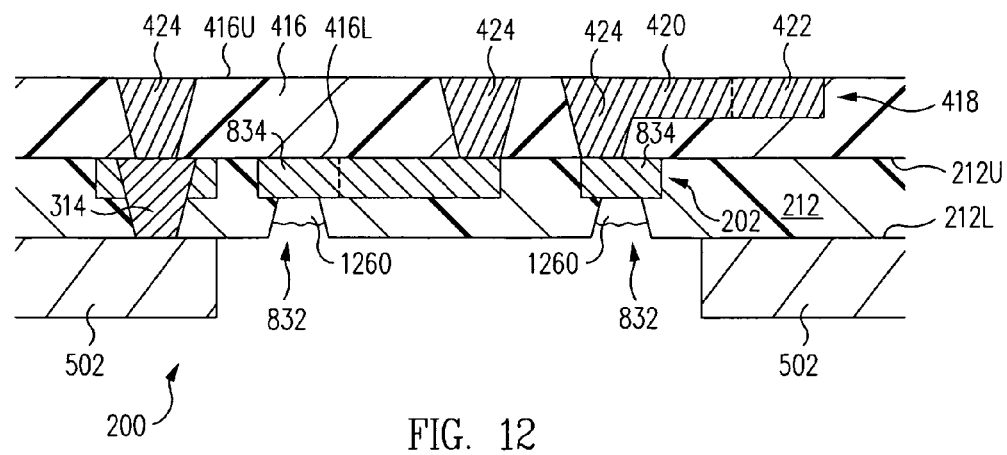
FIGS. 12, 13, and 14 are cross-sectional views of the package of FIG. 5 at various stages during fabrication in accordance with various other embodiments of the present invention.
Figure 13:
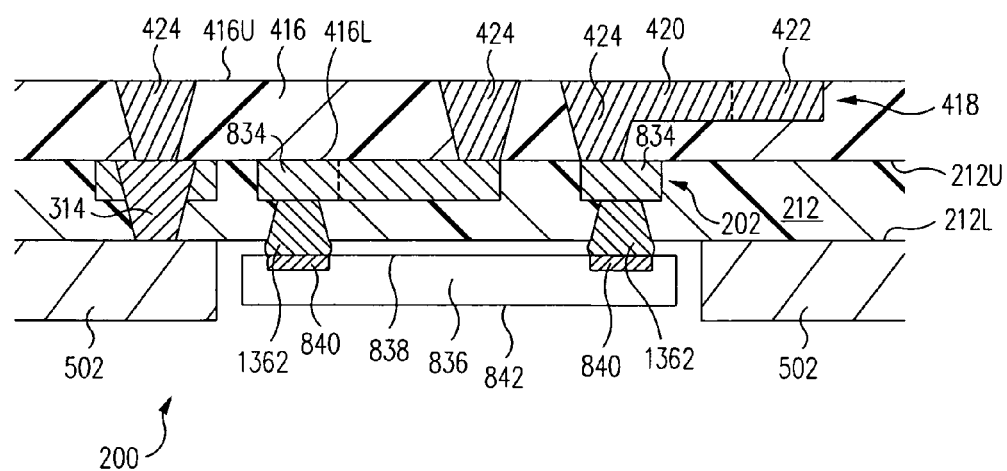
Figure 14:
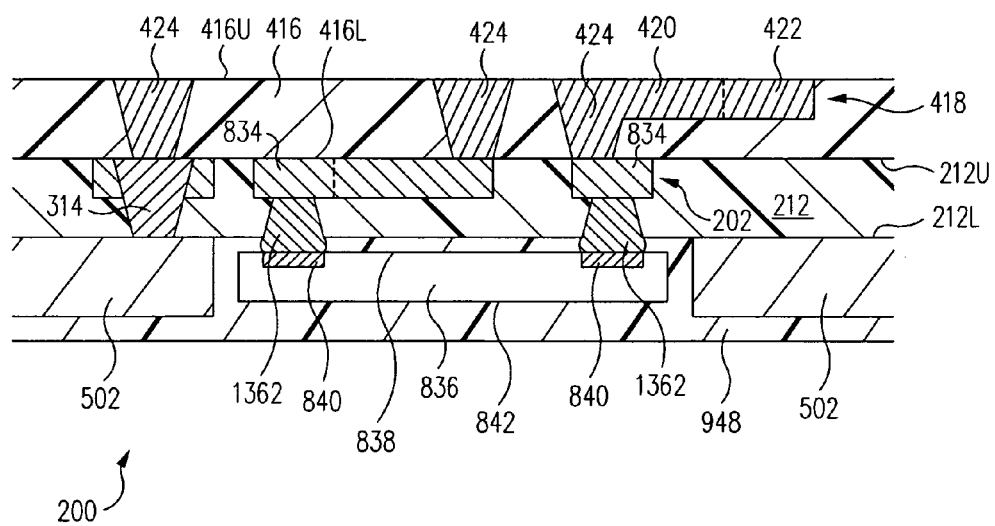

FIGS. 12, 13, and 14 are cross-sectional views of package 200 of FIG. 5 at various stages during fabrication in accordance with various other embodiments of the present invention. Referring now to FIGS. 1, 12 and 13 together, returning again to laser-ablate bond finger openings in dielectric operation 117, in another embodiment, instead of moving to die attach operation 118, flow moves to a flip chip die attach operation 128. In flip chip die attach operation 128, die 836 is flip chip attached to lands 834 of circuit pattern 202.

More particularly, an organic solderability protectant (OSP) 1260 is applied within bond finger openings 832 and on lands 834 as illustrated in FIG. 12. Bond pads 840 of die 836 are flip chip attached to lands 834 of circuit pattern 202 with flip chip bumps 1362 as illustrated in FIG. 13. During this flip chip attachment, OSP 1260 is consumed. Illustratively, bumps 1362 are copper posts, solder bumps, or gold bumps.

Referring now to FIGS. 1 and 14 together, from flip chip die attach operation 128, flow moves, optionally, to encapsulate operation 122, which is performed as discussed above. However, in accordance with this embodiment, package body 948 encapsulates stiffener 502, die 836, flip chip bumps 1362, and the exposed portion of lower surface 212L of dielectric material 212. In one embodiment, during encapsulate operation 122, an underfill material is optionally applied between lower surface 212L of dielectric material 212 and active surface 838 of die 836 and around flip chip bumps 1362 prior to formation of package body 948.

Figure 15:
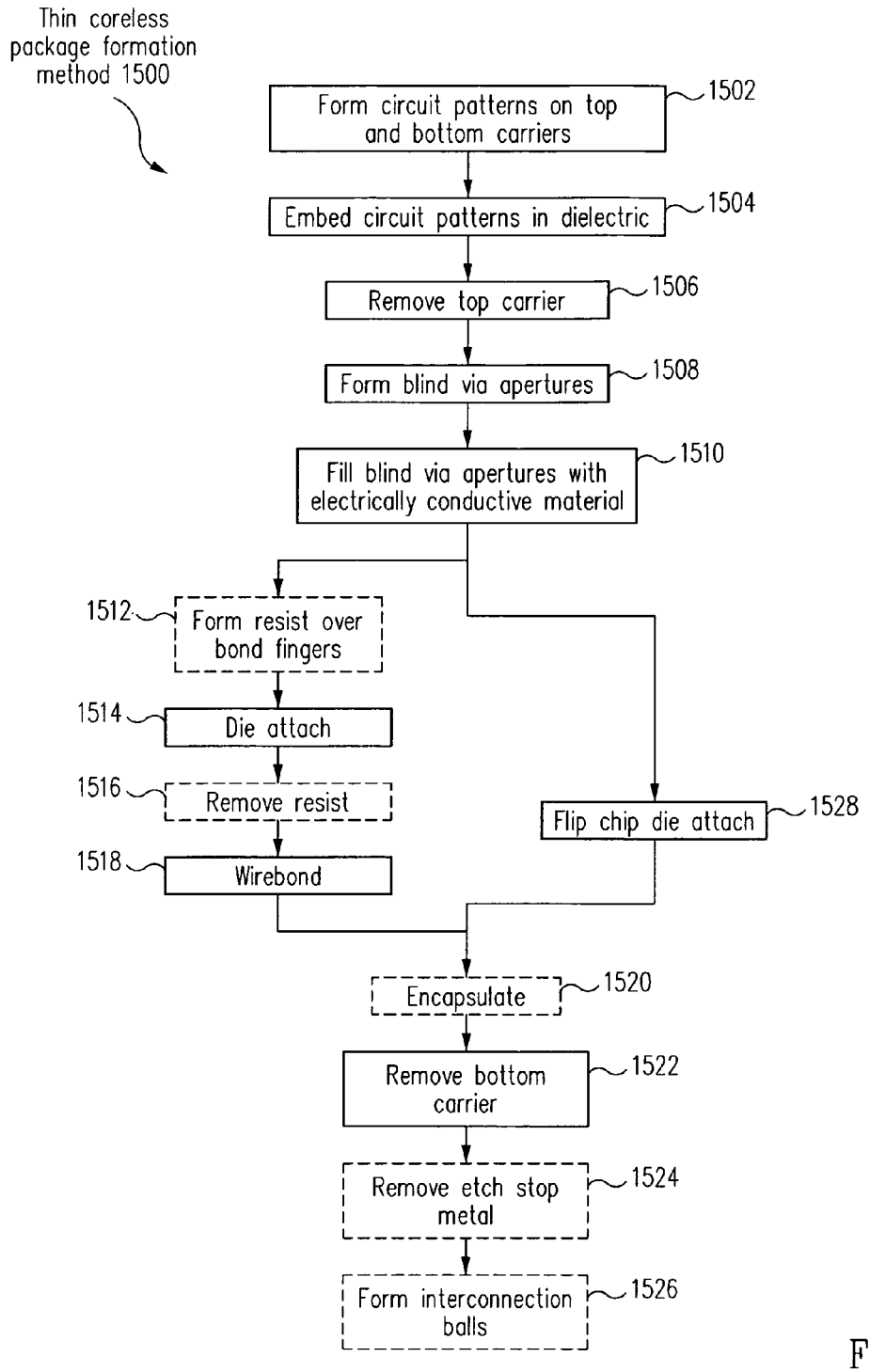
FIG. 15 is a thin coreless package formation method in accordance with one embodiment of the present invention.
Figure 16:
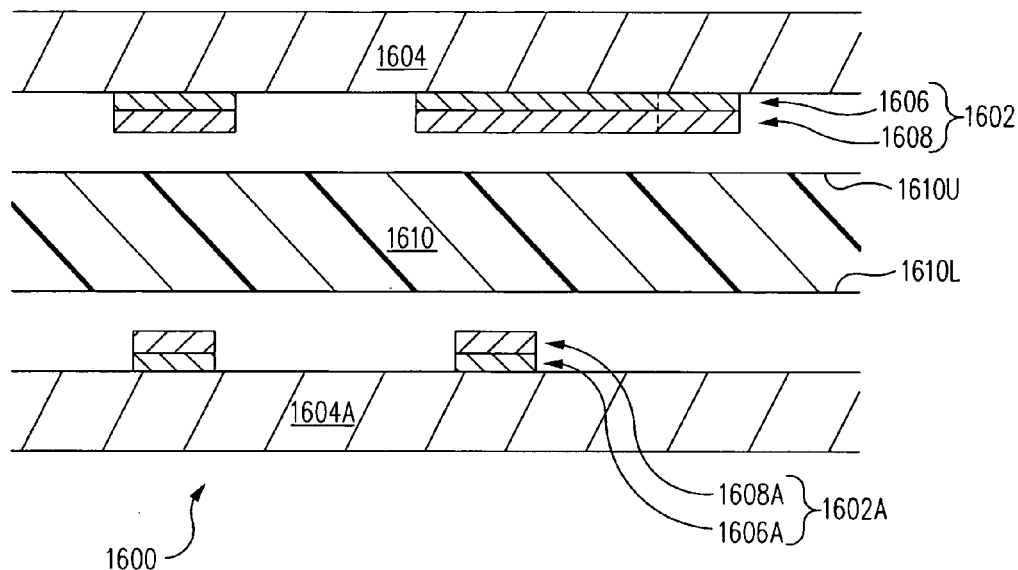
FIG. 16 is a cross-sectional view of a package during fabrication in accordance with one embodiment.

FIG. 15 is a thin coreless package formation method 1500 in accordance with one embodiment of the present invention. FIG. 16 is a cross-sectional view of a package 1600 during fabrication in accordance with one embodiment. FIGS. 17, 18, 19, 20, 21, 22, 23, 24, 25 and 26 are cross-sectional views of package 1600 of FIG. 16 at various stages during fabrication in accordance with various embodiments of the present invention.

Referring now to FIGS. 15 and 16 together, in a form circuit patterns on top and bottom carriers operation 1502, a top, e.g., first, circuit pattern 1602 is formed on a first, e.g., top, carrier 1604 and a bottom, e.g., second, circuit pattern 1602A is formed on a second, e.g., bottom, carrier 1604A, sometimes called a removable carrier. Carriers 1604, 1604A are similar to top carrier 204 and bottom carrier 210 of FIG. 2 and so are not discussed in detail. Bottom carrier 1604A acts as a stiffener during thin coreless package formation method 1500. Further, circuit patterns 1602, 1602A are similar to circuit pattern 202 and formed in a similar manner and so are not discussed in detail.

In accordance with this embodiment, circuit patterns 1602, 1602A include patterned etch stop layers 1606, 1606A and patterned conductor layers 1608, 1608A, respectively. Patterned etch stop layers 1606, 1606A are formed on carriers 1604, 1604A, respectively. Patterned conductor layers 1608, 1608A are formed on patterned etch stop layers 1606, 1606A, respectively. Patterned etch stop layers 1606, 1606A and patterned conductor layers 1608, 1608A are similar to patterned etch stop layer 206 and patterned conductor layer 208 of FIG. 2 and formed in a similar manner, respectively, and so are not discussed in detail.

Figure 17:
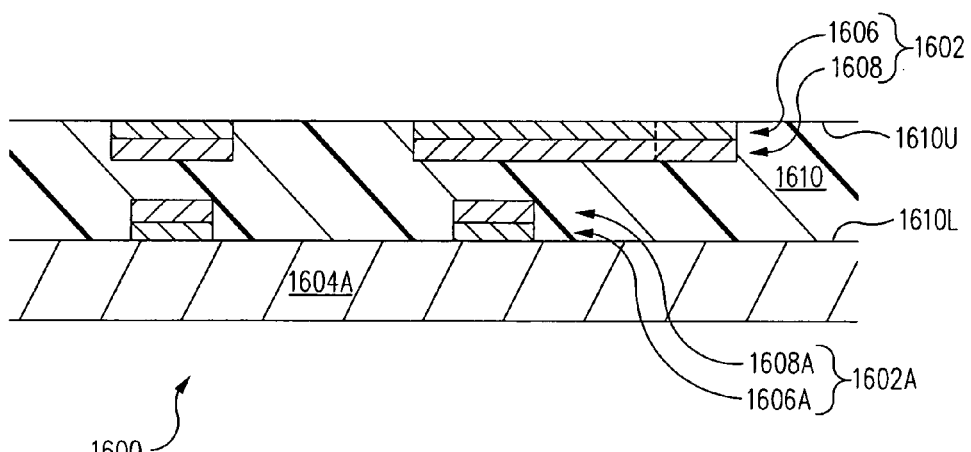
FIGS. 17, 18, 19, 20, 21, 22, 23, 24, 25 and 26 are cross-sectional views of the package of FIG. 16 at various stages during fabrication in accordance with various embodiments of the present invention.

Referring now to FIGS. 15, 16 and 17 together, from form circuit patterns on top and bottom carriers operation 1502, flow moves to an embed circuit patterns in dielectric operation 1504. In embed circuit patterns in dielectric operation 1504, circuit pattern 1602, 1602A are embedded within a dielectric material 1610 in a manner similar to that discussed above in relation to embed circuit pattern in dielectric operation 106 of FIG. 1 and so is not discussed in detail.

More particularly, as shown in FIG. 17, circuit pattern 1602 is embedded into an upper, e.g., first, surface 1610U of dielectric material 1610. Similarly, circuit pattern 1602A is embedded into a lower, e.g., second, surface 1610L of dielectric material 1610. Dielectric material 1610 remains between circuit patterns 1602, 1602A thereby electrically isolating circuit pattern 1602, 1602A from each other.

From embed circuit patterns in dielectric operation 1504, flow moves to a remove top carrier operation 1506. In remove top carrier operation 1506, top carrier 1604 is removed, e.g., using a selective etch as discussed above, resulting in the structure as illustrated in FIG. 17.

Figure 18:
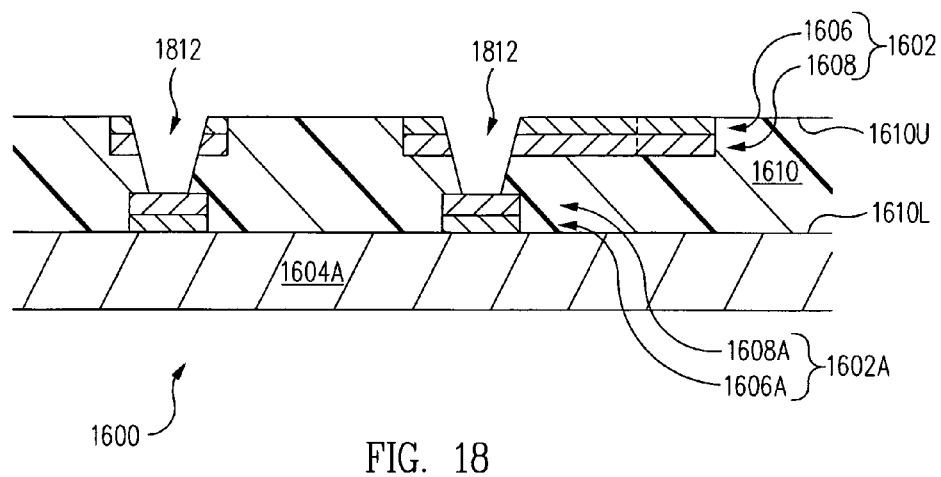

Referring now to FIGS. 15 and 18 together, from remove top carrier operation 1506, flow moves to a form blind via apertures operation 1508. In form blind via apertures operation 1508, blind via apertures 1812 are formed. Blind via apertures 1812 extend through dielectric material 1610 between upper surface 1610U and lower surface 1610L.

In one embodiment, blind via apertures 1812 are formed in dielectric material 1610 using laser-ablation and thus have a taper shape as illustrated. Generally, blind via apertures 1812 are formed between top circuit pattern 1602 and bottom circuit pattern 1602A.

Figure 19:
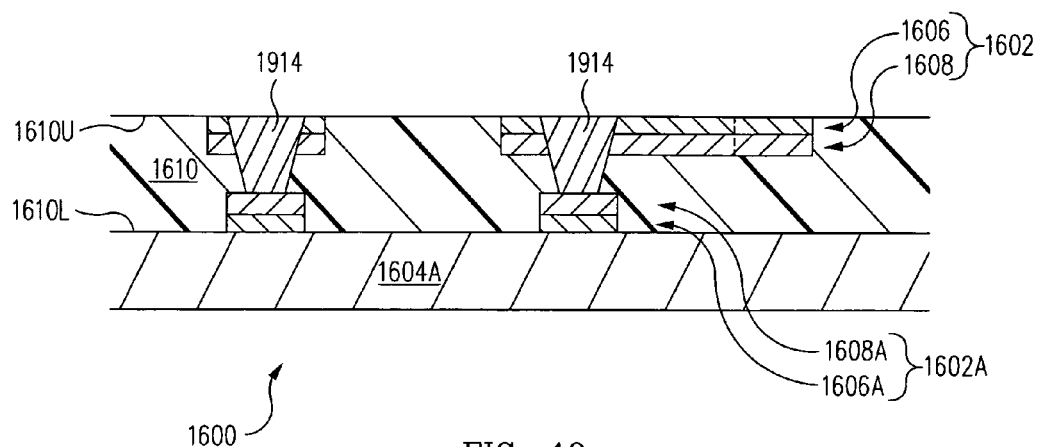

Referring now to FIGS. 15 and 19 together, from form blind via apertures operation 1508, flow moves to a fill blind via apertures with electrically conductive material operation 1510. In fill blind via apertures with electrically conductive material operation 1510, blind via apertures 1812 are filled, e.g., with plated copper or other conductive material, to form electrically conductive blind vias 1914. Blind vias 1914 extend between and electrically connect circuit patterns 1602, 1602A with one another through dielectric material 1610.

Figure 20:
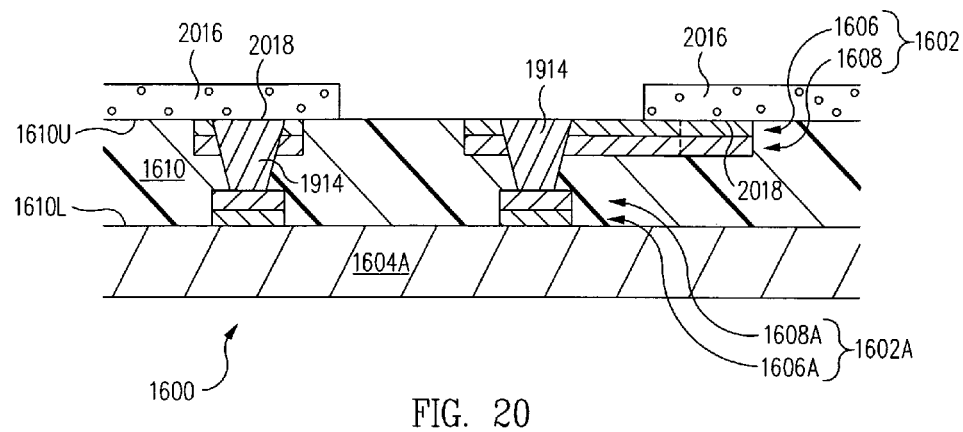

Referring now to FIGS. 15 and 20 together, from fill blind via apertures with electrically conductive material operation 1510, flow moves, optionally, to a form resist over bond fingers operation 1512. In form resist over bond fingers operation 1512, photoresist 2016 is selectively formed over bond fingers 2018, sometimes called lands, of top circuit pattern 1602. In one embodiment, the exposed top surface of a blind via 1914 forms a bond fingers 2018. Photoresist 2016 is formed using any one of a number of techniques and the particular technique used is not essential to this embodiment.

Figure 21:
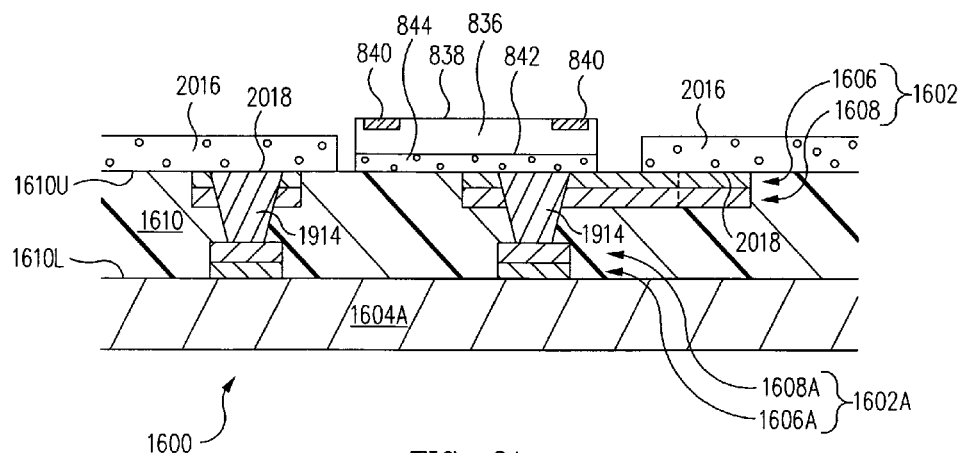

Referring now to FIGS. 15 and 21 together, from form resist over bond fingers operation 1512 (or directly from fill blind via apertures with electrically conductive material operation 1510 if form resist over bond fingers operation 1512 is not performed), flow moves to a die attach operation 1514. In die attach operation 1514, die 836 is die attached to upper surface 1610U of dielectric material 1610. In the embodiment illustrated in FIG. 21, in addition to being attached to upper surface 1610U of dielectric material 1610, die 836 is also die attached directly to top circuit pattern 1602 and the exposed top surface of a blind via 1914. Die 836 is attached without use of a soldermask over top circuit pattern 1602 and the exposed top surface of blind via 1914.

More particularly, inactive surface 842 is attached to upper surface 1610U of dielectric material 1610, top circuit pattern 1602 and/or the exposed top surface of a blind via 1914 by die attach adhesive 844. Photoresist 2016 protects bond fingers 2018 during the die attach operation, i.e., prevents die attach adhesive 844 from overflowing onto and contaminating bond fingers 2018.

Figure 22:
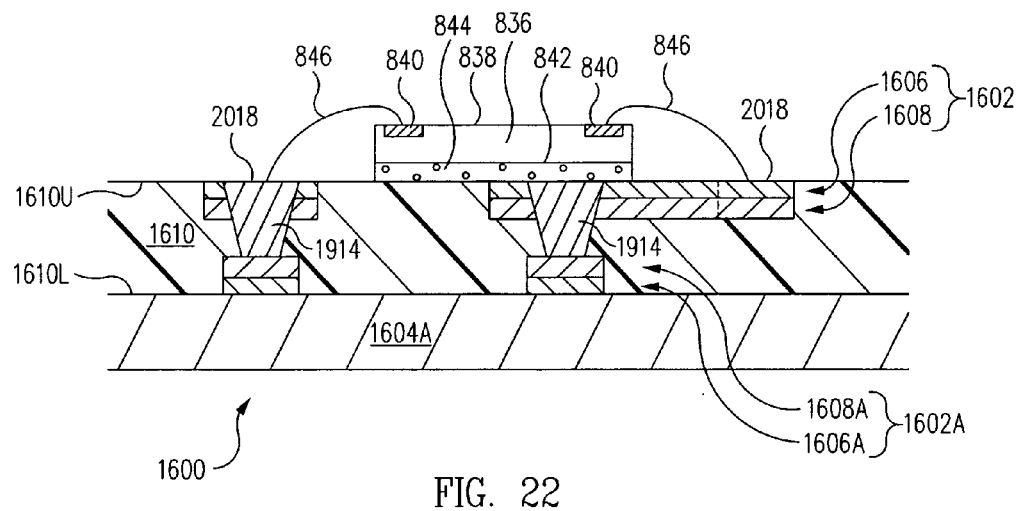

Referring now to FIGS. 15 and 22 together, from die attach operation 1514, flow moves, optionally, to a remove resist operation 1516. In remove resist operation 1516, photoresist 2016 is removed. As discussed above, formation of photoresist 2016 is optional. Accordingly, if photoresist 2016 is not formed, remove resist operation 1516 is not performed and thus is an optional operation.

From remove resist operation 1516 (or directly from die attach operation 1514 if remove resist operation 1516 is not performed), flow moves to a wirebond operation 1518.

In wirebond operation 1518, bond pads 840 of die 836 are wire bonded (electrically connected) to bond fingers 2018 by bond wires 846.

Figure 23:
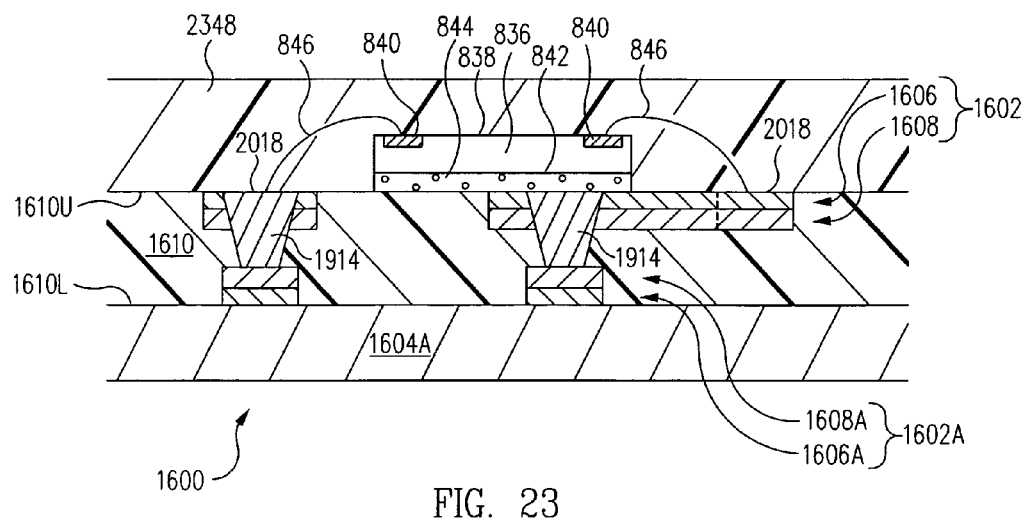

Referring now to FIGS. 15 and 23 together, from wirebond operation 1518, flow moves, optionally, to an encapsulate operation 1520. In encapsulate operation 1520, die 836, bond wires 846, and the exposed portion of upper surface 1610U of dielectric material 1610 are encapsulated in a package body 2348. Illustratively, package body 2348 is formed by molding.

Figure 24:
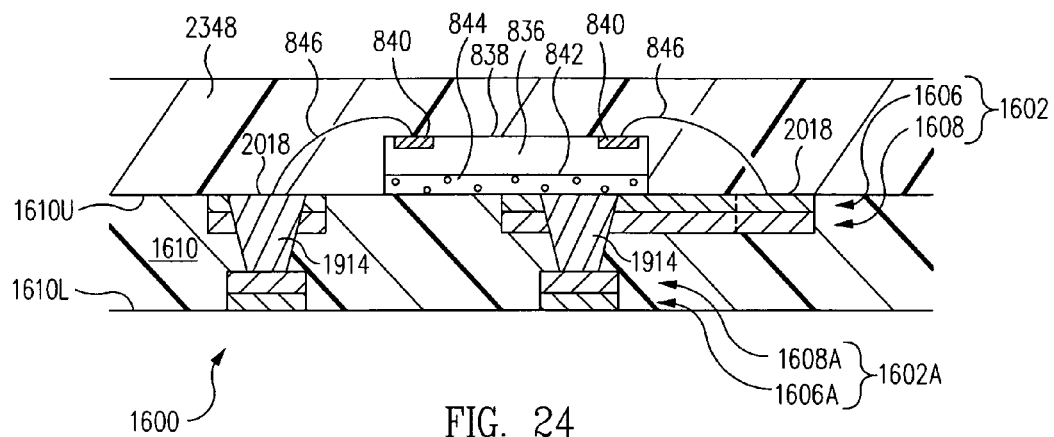

Referring now to FIGS. 15, 23 and 24 together, from encapsulate operation 1520 (or directly from wirebond operation 1518 if encapsulate operation 1520 is not performed), flow moves to a remove bottom carrier operation 1522. In remove bottom carrier operation 1522, bottom carrier 1604A is removed, e.g., using a selective etch process as discussed above. By retaining bottom carrier 1604A in the operations leading up to remove bottom carrier operation 1522, bottom carrier 1604A acts a stiffener during the manufacture of package 1600.

Figure 25:
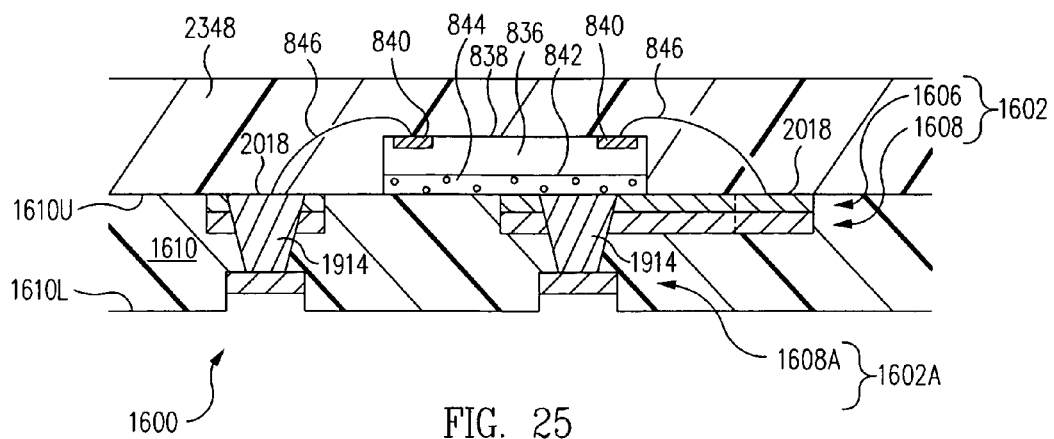

Referring now to FIGS. 15, 24 and 25 together, from remove bottom carrier operation 1522, flow moves, optionally, to a remove etch stop metal operation 1524. In remove etch stop metal operation 1524, patterned etch stop layer 1606A of bottom circuit pattern 1602A is removed. Illustratively, patterned etch stop layer 1606A is removed using a selective etch that etches etch stop layer 1606A and not patterned conductor layer 1608A. In one embodiment, after removal of patterned etch stop layer 1606A, the resulting recesses in bottom surface 1610L of dielectric material 1610 define ball grid array (BGA) openings in which interconnection balls are formed as discussed below. In one embodiment, a soldermask is applied to bottom surface 1610L of dielectric material 1610 to further define ball grid array (BGA) openings.

Figure 26:
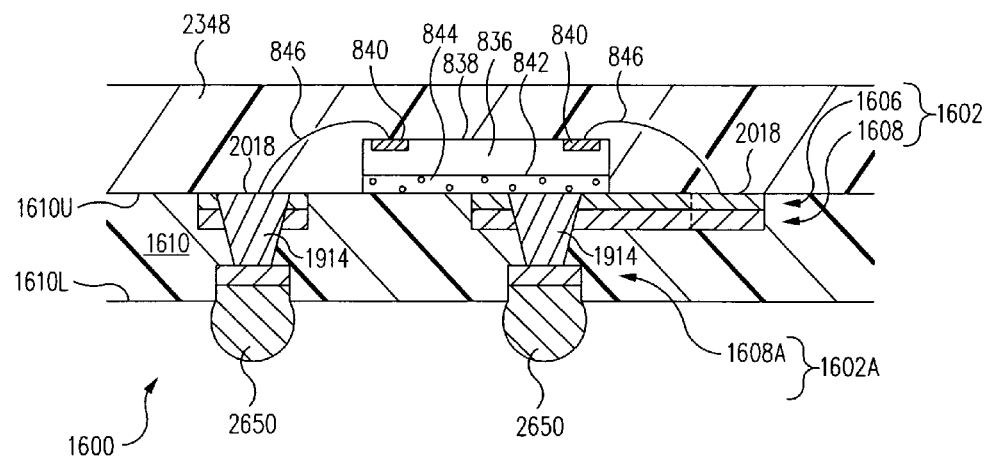

Referring now to FIGS. 15 and 26 together, from remove etch stop metal operation 1524 (or directly from remove bottom carrier operation 1522 if remove etch stop metal operation 1524 is not performed), flow moves, optionally, to a form interconnection balls operation 1526.

In form interconnection balls operation 1526, interconnection balls 2650, e.g., solder balls, are formed on bottom circuit pattern 1602A, which is formed of patterned conductor layer 1608A in the event that remove etch stop metal operation 1524 is performed. More particularly, interconnection balls 2650 are electrically connected to bottom circuit pattern 1602A.

Interconnection balls 2650 are used to connect package 1600 to a larger substrate, e.g., to a printed circuit motherboard. In one embodiment, interconnection balls 2650 are distributed in an array thus forming a ball grid array (BGA) package. In other embodiments, other types of packages are formed, e.g., a metal land grid array (LGA) type package or a leadless chip carrier (LCC) type package or other type of package and thus form interconnection balls operation 1526 is optional.

Referring again to fill blind via apertures with electrically conductive material operation 1510, in another embodiment, instead of moving to form resist over bond fingers operation 1512, flow moves to a flip chip die attach operation 1528.

Figure 27:
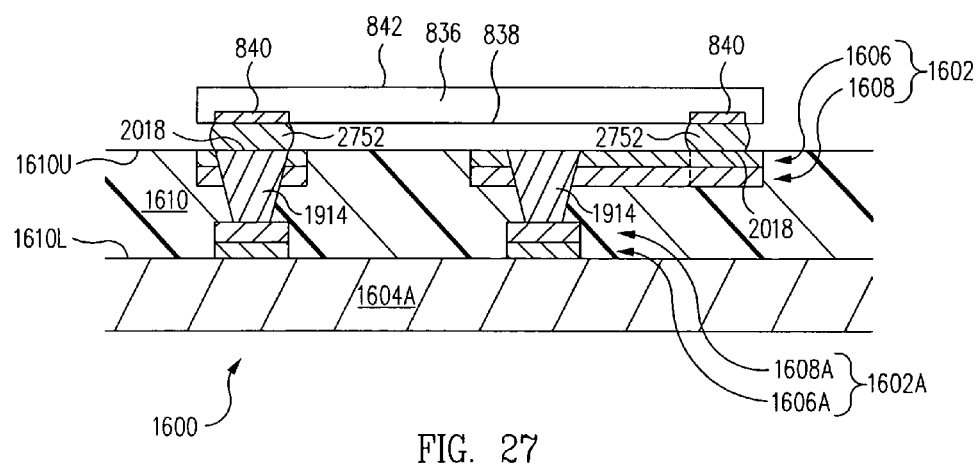
FIG. 27 is a cross-sectional view of the package of FIG. 19 at a further stage during fabrication in accordance with another embodiment.

FIG. 27 is a cross-sectional view of package 1600 of FIG. 19 at a further stage during fabrication in accordance with another embodiment. Referring now to FIGS. 15 and 27 together, in flip chip die attach operation 1528, die 836 is flip chip attached to bond fingers 2018. More particularly, bond pads 840 of die 836 are physically and electrically connected to bond fingers 2018 by flip chip bumps 2752.

From flip chip die attach operation 1528, flow moves, optionally, to encapsulate operation 1520, or directly to remove bottom carrier operation 1522, either of which is performed as discussed above. In one embodiment, an underfill is applied between upper surface 1610U of dielectric material 1610 and active surface 838 of die 836 and around flip chip bumps 2752 prior to formation of package body 2348 (formation of package body 2348 is discussed above in reference to FIG. 23).

Figure 28:
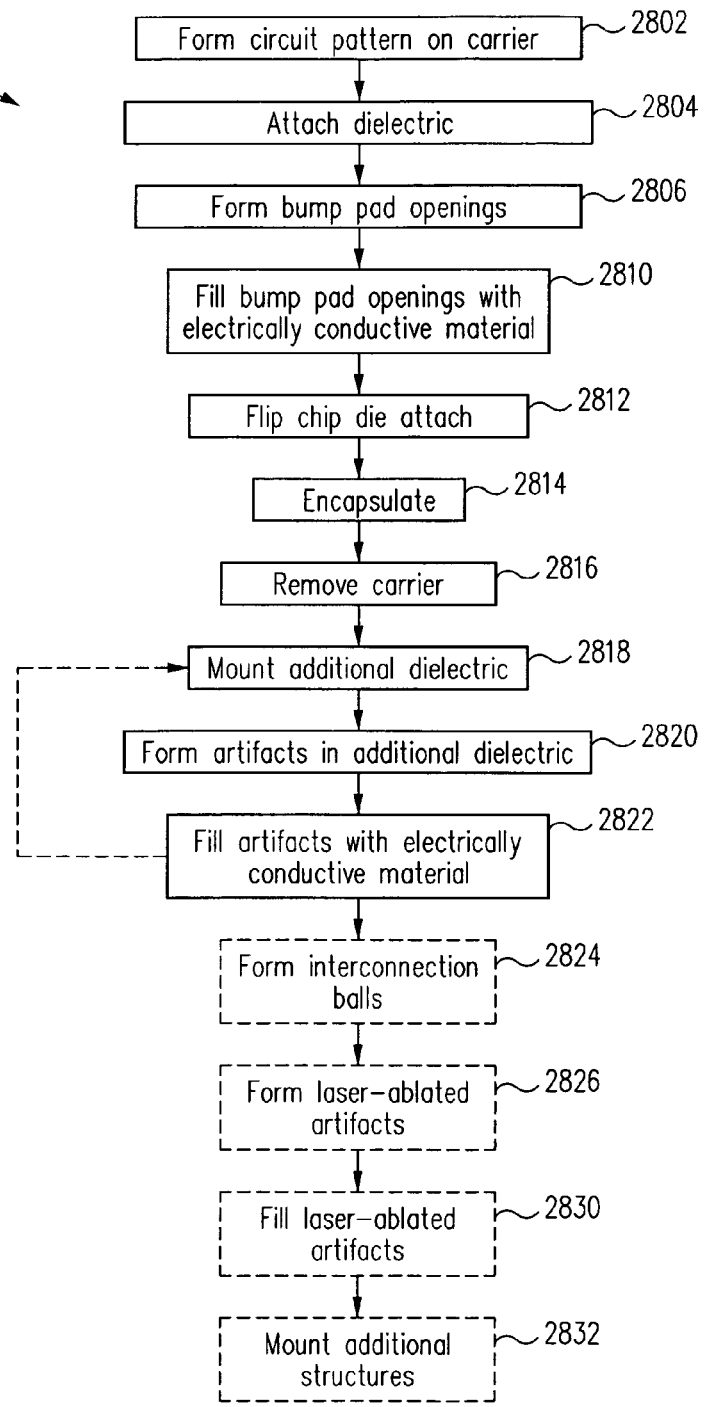
FIG. 28 is a copper pillar flip chip in substrate formation method in accordance with one embodiment of the present invention.
Figure 29:
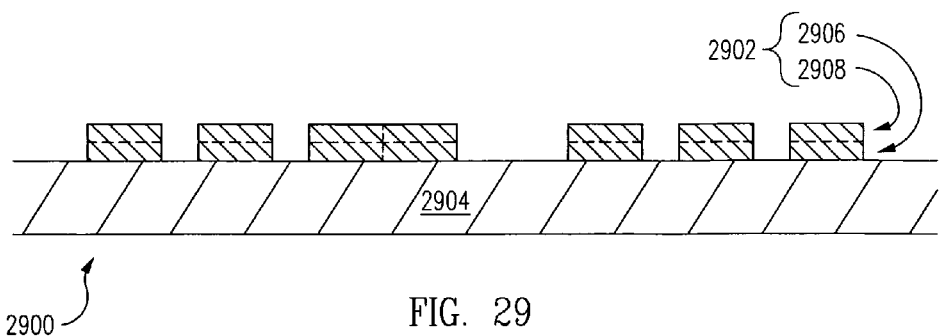
FIG. 29 is a cross-sectional view of a package during fabrication in accordance with one embodiment.

FIG. 28 is a copper pillar flip chip in substrate formation method 2800 in accordance with one embodiment of the present invention. FIG. 29 is a cross-sectional view of a package 2900 during fabrication in accordance with one embodiment. FIGS. 30, 31, 32, 33, 34, 35, 36 are cross-sectional views of package 2900 of FIG. 29 at various stages during fabrication in accordance with various embodiments of the present invention.

Referring now to FIGS. 28 and 29 together, in a form circuit pattern on carrier operation 2802, a circuit pattern 2902 is formed on a carrier 2904. Carrier 2904 is similar to top carrier 204 of FIG. 2 and so is not discussed in detail. Further, circuit pattern 2902 is similar to circuit pattern 202 of FIG. 2 and formed in a similar manner and so is not discussed in detail.

In accordance with this embodiment, circuit pattern 2902 includes patterned etch stop layer 2906 and patterned conductor layer 2908. Patterned etch stop layer 2906 is formed on carrier 2904. Patterned conductor layer 2908 is formed on patterned etch stop layer 2906. Patterned etch stop layer 2906 and patterned conductor layer 2908 are similar to patterned etch stop layer 206 and patterned conductor layer 208 of FIG. 2 and formed in a similar manner, respectively, and so are not discussed in detail.

Although circuit pattern 2902 is illustrated and discussed above as a bi-layer structure, in another embodiment, circuit pattern 2902 is a single layer of conductive material. Except in FIG. 29, circuit pattern 2902 is illustrated as a single layer of conductive material for simplicity. However, in light of this disclosure, it is to be understood that circuit pattern 2902 can include a multilayer structure such as the bi-layer structure illustrated in FIG. 29.

Figure 30:
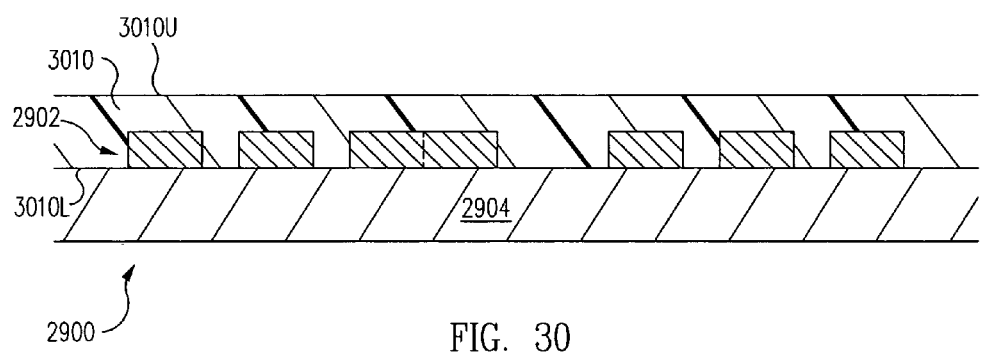
FIGS. 30, 31, 32, 33, 34, 35, 36 are cross-sectional views of the package of FIG. 29 at various stages during fabrication in accordance with various embodiments of the present invention.

Referring now to FIGS. 28 and 30 together, from form circuit pattern on carrier operation 2802, flow moves to an attach dielectric operation 2804. In attach dielectric operation 2804, a dielectric material 3010 is attached to circuit pattern 2902 and carrier 2904.

More particularly, as shown in FIG. 30, circuit pattern 2902 is embedded into a lower, e.g., first, surface 3010L of dielectric material 3010. Dielectric material 3010 is attached around circuit pattern 2902 and to carrier 2904. Generally, dielectric material 3010 is attached to encapsulate circuit pattern 2902 within dielectric material 3010 such that dielectric material 3010 contacts carrier 2904 in the spaces between circuit pattern 2902 as shown in FIG. 30. Dielectric material 3010 remains between circuit pattern 2902 and an upper, e.g., second, surface 3010U of dielectric material 3010.

Figure 31:
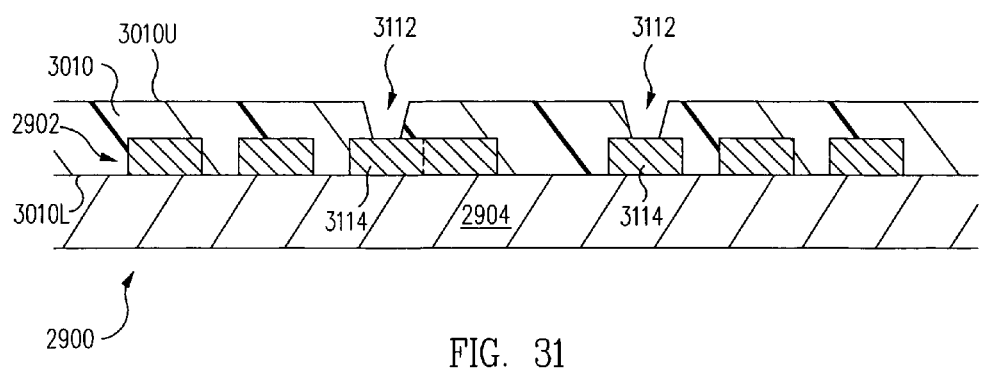

Referring now to FIGS. 28 and 31 together, from attach dielectric operation 2804, flow moves to a form bump pad openings operation 2806. In form bump pad openings operation 2806, bump pad openings 3112 are formed within dielectric layer 3010 to expose lands 3114 of circuit pattern 2902. Bump pad openings 3112 extend from upper surface 3010U of dielectric material 3010, through dielectric material 3010 to expose lands 3114. In one embodiment, bump pad openings 3112 are formed using a laser-ablation process and thus have a taper shaped as illustrated in FIG. 31.

Figure 32:
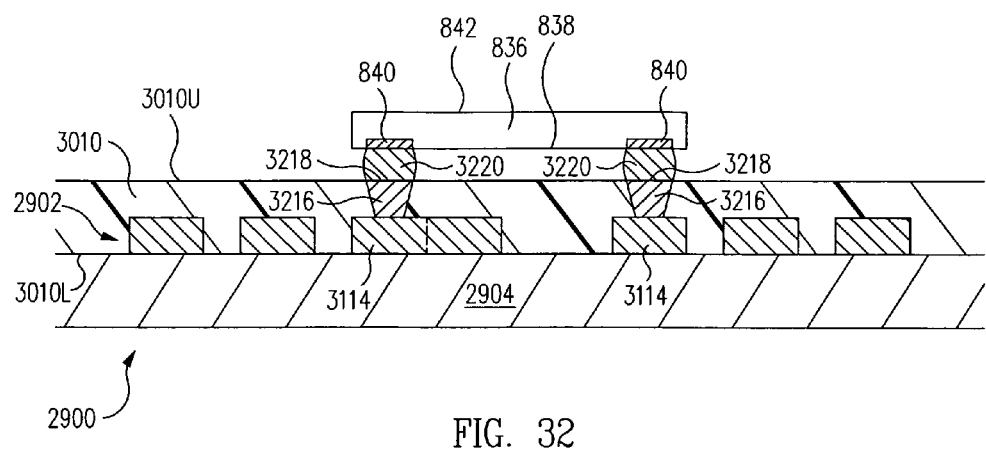

Referring now to FIGS. 28, 31 and 32 together, from form bump pad openings operation 2806, flow moves to a fill bump pad openings with electrically conductive material operation 2810. In fill bump pad openings with electrically conductive material operation 2810, bump pad openings 3112 are filled with electrically conductive material, e.g., tin plating, to form electrically conductive vias 3216 within bump pad openings 3112. Vias 3216 extend from upper surface 3010U of dielectric material 3010, through dielectric material 3010, to contact and be electrically connected to lands 3114.

Vias 3216 include upper exposed surfaces that define lands 3218, which are coplanar with upper surface 3010U of dielectric material 3010.

From fill bump pad openings with electrically conductive material operation 2810, flow moves to a flip chip die attach operation 2812. In flip chip die attach operation 2812, die 836 is flip chip attached to vias 3216. More particularly, bond pads 840 of die 836 are physically and electrically connected to lands 3218 of vias 3216 by flip chip bumps 3220. Flip chip bumps 3220 are copper pillars or gold stud bumps in various embodiments although solder can be used.

Figure 33:
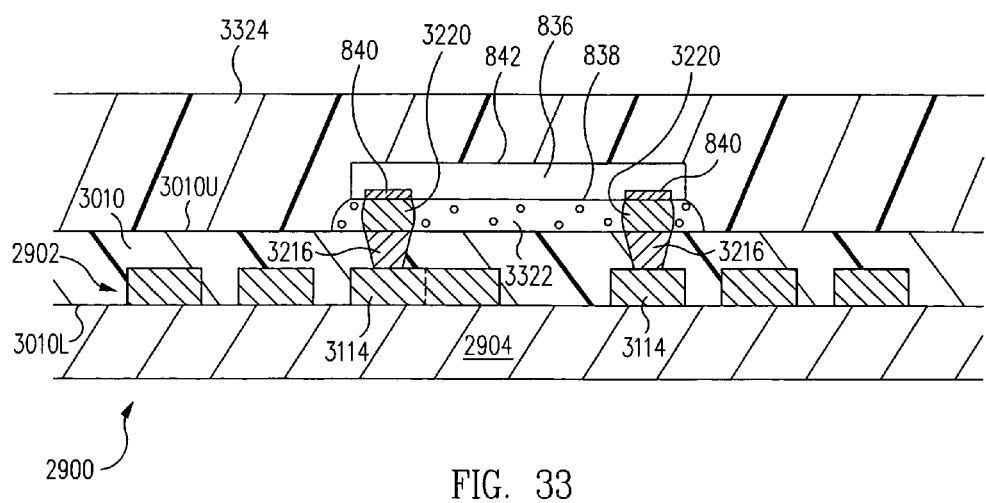

Referring now to FIGS. 28 and 33 together, from flip chip die attach operation 2812, flow moves to an encapsulate operation 2814. In one embodiment, an underfill material 3322 is applied between upper surface 3010U of dielectric material 3010 and active surface 838 of die 836 and around flip chip bumps 3220. A package body 3324 is then applied to encapsulate die 836, underfill 3322, and the exposed portion of upper surface 3010U of dielectric material 3010.

Underfill material 3322 is optional and in one embodiment is not formed. In accordance with this embodiment, package body 3324 fills the space between upper surface 3010U of dielectric material 3010 and active surface 838 of die 836 and around flip chip bumps 3220. Accordingly, although underfill material 3322 is not illustrated except in FIG. 33, in light of this disclosure, those of skill in the art will understand that underfill material 3322 can be formed and would be illustrated in the remaining figures.

Figure 34:
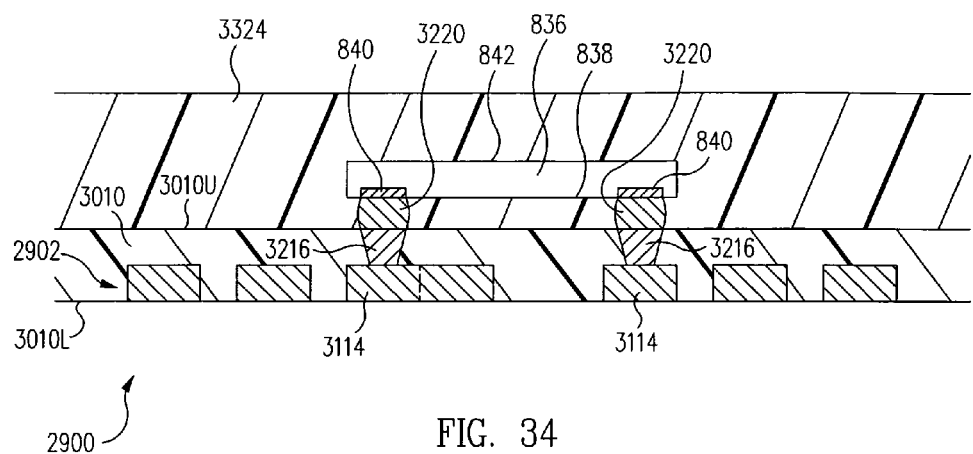

Referring now to FIGS. 28, 33 and 34 together, from encapsulate operation 2814, flow moves to a remove carrier operation 2816. In remove carrier operation 2816, carrier 2904 is removed, e.g., using a selective etch as discussed above, resulting in the structure as illustrated in FIG. 34.

Figure 35:
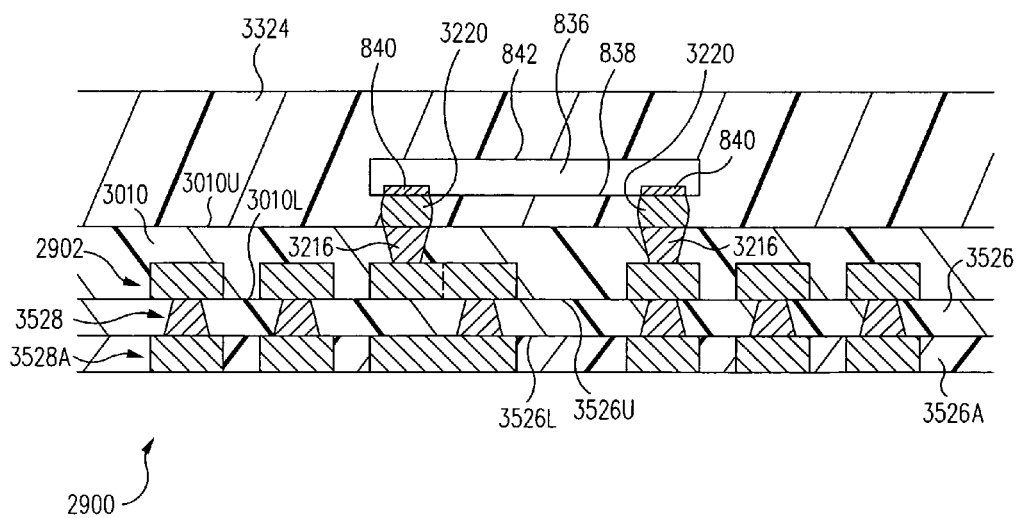

Referring now to FIGS. 28 and 35 together, from remove carrier operation 2816, flow moves to a mount additional dielectric operation 2818. In mount additional dielectric operation 2818, an upper, e.g., first, buildup dielectric material 3526 is mounted to dielectric material 3010 and circuit pattern 2902.

More particularly, an upper, e.g., first, surface 3526U of upper buildup dielectric material 3526 is mounted to lower surface 3010L of dielectric material 3010. Upper buildup dielectric material 3526 further includes a lower, e.g., second, surface 3526L opposite upper surface 3526U.

From mount additional dielectric operation 2818, flow moves to a form artifacts in additional dielectric operation 2820. In form artifacts in additional dielectric operation 2820, upper buildup dielectric material 3526 is laser-ablated resulting in the formation of laser-ablated artifacts in upper buildup dielectric material 3526.

The laser-ablated artifacts are formed using a laser-ablation process in a manner similar to that described above regarding form artifacts in additional dielectric operation 112 of FIG. 1 and so is only briefly repeated here. During this laser-ablation process, a laser beam is directed at upper buildup dielectric material 3526 and moved. The laser beam laser-ablates at least partially, and in some places through, upper buildup dielectric material 3526. Accordingly, the laser-ablated artifacts are formed at least partially, and in some places through, upper buildup dielectric material 3526. The laser-ablated artifacts include laser-ablated channels, laser-ablated land openings, and/or laser-ablated via apertures.

From form artifacts in additional dielectric operation 2820, flow moves to a fill artifacts with electrically conductive material operation 2822.

In fill artifacts with electrically conductive material operation 2822, the laser-ablated artifacts are filled with an electrically conductive filler material, e.g., copper, to form an upper, e.g., first, buildup circuit pattern 3528 as illustrated in FIG. 35. The laser-ablated artifacts are filled with an electrically conductive filler material in a manner similar to that described above regarding fill artifacts with electrically conductive material operation 114 of FIG. 1 and so is only briefly discussed here.

As shown in FIG. 35, upper buildup circuit pattern 3528 is embedded within upper buildup dielectric material 3526. Upper buildup circuit pattern 3528 includes electrically conductive traces, lands, and/or vias. In one embodiment, upper buildup circuit pattern 3528 redistributes the pattern of circuit pattern 2902 to the pattern of upper buildup circuit pattern 3528.

As indicated by the dashed arrow in FIG. 28, operations 2818, 2820, and 2822 can be repeated any one of a number of times to form additional buildup circuit patterns in additional buildup dielectric materials. In accordance with the embodiment illustrated in FIG. 35, operations 2818, 2820, and 2822 are repeated a second time to form a lower, e.g., second, buildup circuit pattern 3528A in a lower, e.g., second, buildup dielectric material 3526A. Lower buildup circuit pattern 3528A redistributes the pattern of upper buildup circuit pattern 3528 to the pattern of lower buildup circuit pattern 3528A.

Figure 36:
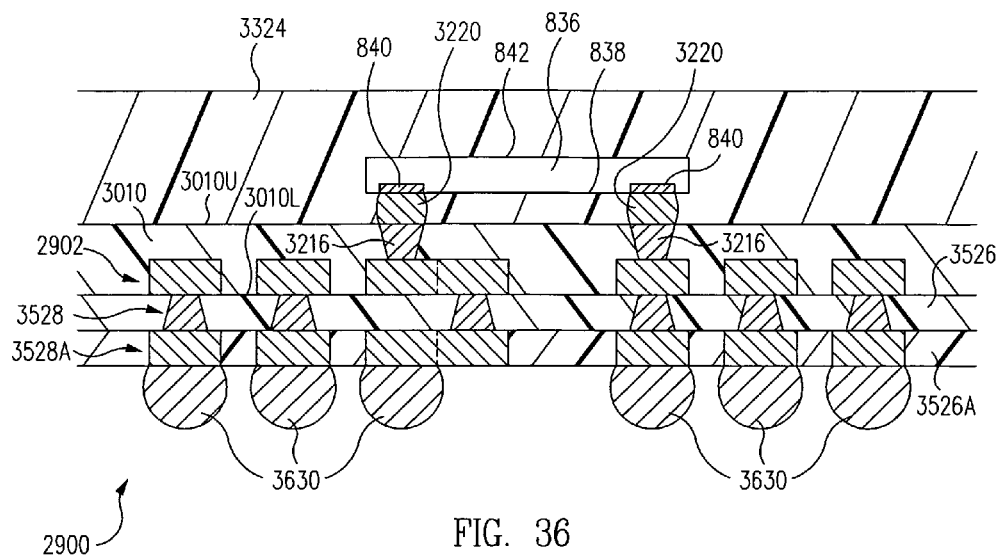

Referring now to FIGS. 28 and 36 together, from fill artifacts with electrically conductive material operation 2822, flow moves, optionally, to a form interconnection balls operation 2824. In form interconnection balls operation 2824, interconnection balls 3630, e.g., solder balls, are formed on lower buildup circuit pattern 3528A. More particularly, interconnection balls 3630 are electrically connected to lower buildup circuit pattern 3528A.

Interconnection balls 3630 are used to connect package 2900 to a larger substrate, e.g., to a printed circuit motherboard. In one embodiment, interconnection balls 3630 are distributed in an array thus forming a ball grid array (BGA) package. In other embodiments, other types of packages are formed, e.g., a metal land grid array (LGA) type package or a leadless chip carrier (LCC) type package or other type of package and thus form interconnection balls operation 2824 is optional. Package 2900 of FIG. 36 is an example of a chip in substrate (CIS) package.

Figure 37:
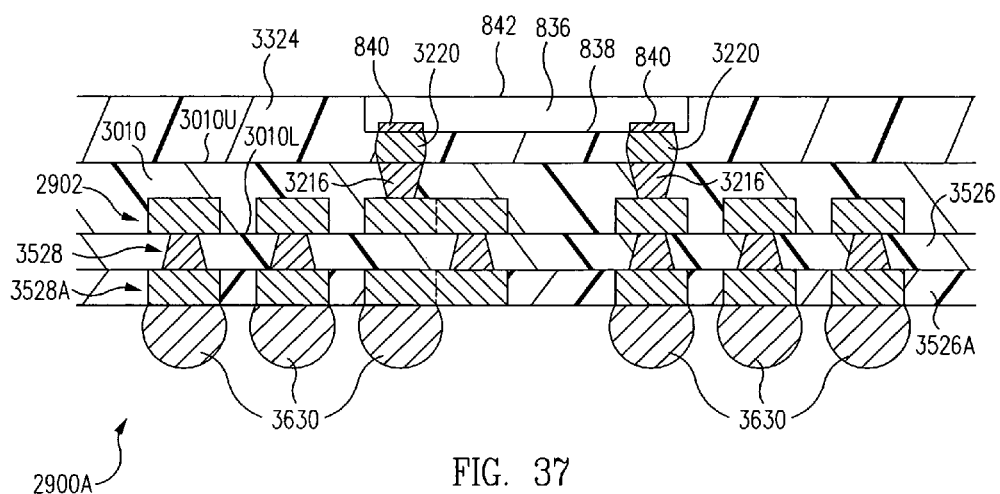
FIGS. 37, 38, 39, 40, and 41 are cross-sectional views of packages in accordance with various other embodiments of the present invention.

FIG. 37 is a cross-sectional view of a package 2900A in accordance with another embodiment. Package 2900A of FIG. 37 is an example of an exposed chip in substrate (CIS) package. Package 2900A of FIG. 37 is similar to package 2900 of FIG. 36 and only the significant differences between the packages are discussed below. Referring now to FIG. 37, in accordance with this embodiment, package body 3324 partially encapsulates die 836 such that inactive surface 842 of die 836 is exposed. In this manner, heat transfer from die 836 to the ambient environment is maximized. In another example, a heat sink is attached to exposed inactive surface 842 of die 836.

Figure 38:
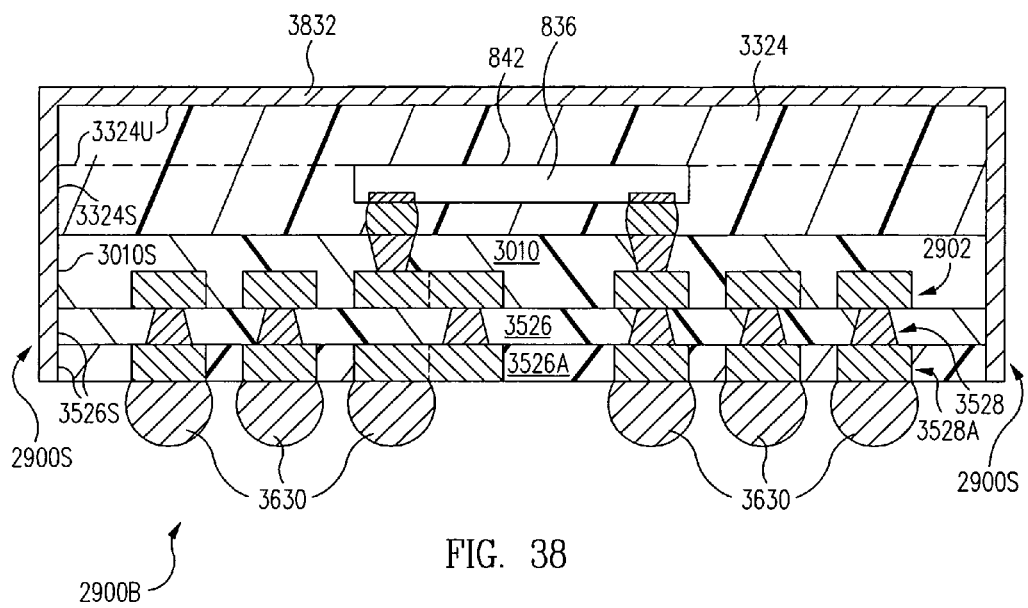

FIG. 38 is a cross-sectional view of a package 2900B in accordance with another embodiment. Package 2900B of FIG. 38 is an example of a chip in substrate (CIS) plus shielding package. Package 2900B of FIG. 38 is similar to package 2900 of FIG. 36 and only the significant differences between the packages are discussed below. Referring now to FIG. 38, in accordance with this embodiment, an electrically conductive shielding layer 3832, e.g., copper or other electrically conductive material, is formed on an upper, e.g., first, surface 3324U of package body 3324.

In accordance with this embodiment, shielding layer 3832 extends around sides 2900S of package 2900B. Sides 2900S are defined by coplanar sides 3324S of package body 3324, sides 3010S of dielectric material 3010, and sides 3526S of upper and lower buildup dielectric materials 3526, 3526A. However, in another embodiment, shielding layer 3832 is formed only on upper surface 3324U of package body 3324.

Referring now to FIGS. 37 and 38 together, as indicated by the dashed line in FIG. 38, shielding layer 3832 can be formed on the embodiment illustrated in FIG. 37. In accordance with this embodiment, shielding layer 3832 is formed on upper surface 3324U of package body 3324 and also on inactive surface 842 of die 836, which are coplanar with one another.

Figure 39:
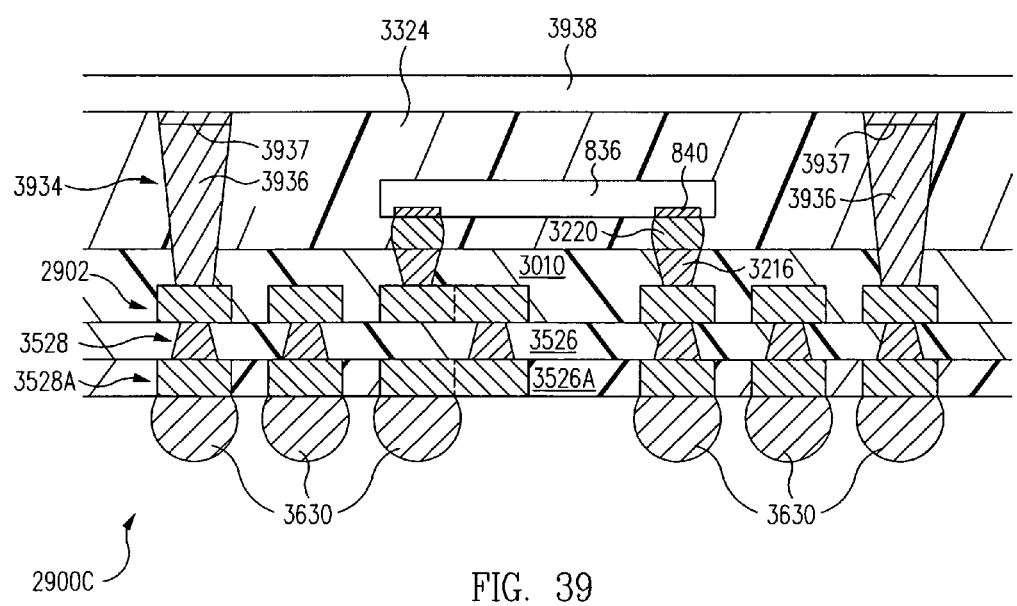

FIG. 39 is a cross-sectional view of a package 2900C in accordance with another embodiment. Package 2900C of FIG. 39 is an example of a chip in substrate (CIS) plus soldered top interposer package. Package 2900C of FIG. 39 is similar to package 2900 of FIG. 36 and only the significant differences between the packages are discussed below. Referring now to FIGS. 28 and 39 together, from form interconnection balls operation 2824 (or directly from fill artifacts with electrically conductive material operation 2822 if form interconnection balls operation 2824 is not performed), flow moves to a form laser-ablated artifacts operation 2826.

In form laser-ablated artifacts operation 2826, package body 3324 and dielectric material 3010 are laser-ablated resulting in the formation of laser-ablated artifacts extending through package body 3324 and dielectric material 3010 and to circuit pattern 2902. More particularly, portions of circuit pattern 2902 are exposed through the laser-ablated artifacts.

The laser-ablated artifacts are formed using a laser-ablation process in a manner similar to that described above regarding form artifacts in additional dielectric operation 112 of FIG. 1 and so is only briefly repeated here. During this laser-ablation process, a laser beam is directed at package body 3324 and moved. The laser beam laser-ablates at least partially, and in some places through, package body 3324 and dielectric material 3010. Accordingly, the laser-ablated artifacts are formed at least partially, and in some places through, package body 3324.

Further, the laser-ablated artifacts are formed through dielectric material 3010 to expose portions of circuit pattern 2902. The laser-ablated artifacts include laser-ablated channels, laser-ablated land openings, and/or laser-ablated via apertures. The laser-ablated via apertures extend through both package body 3324 and dielectric material 3010 to expose portions of circuit pattern 2902.

From form laser-ablated artifacts 2826, flow moves to a fill laser-ablated artifacts operation 2830. In fill laser-ablated artifacts operation 2830, the laser-ablated artifacts are filled with an electrically conductive filler material, e.g., copper, to form redistribution circuit pattern 3934 as illustrated in FIG. 39. The laser-ablated artifacts are filled with an electrically conductive filler material in a manner similar to that described above regarding fill artifacts with electrically conductive material operation 114 of FIG. 1 and so is only briefly discussed here.

As shown in FIG. 39, redistribution circuit pattern 3934 is embedded within package body 3324 and dielectric material 3010. Redistribution circuit pattern 3934 includes electrically conductive traces, lands, and/or vias. In accordance with this embodiment, redistribution circuit pattern 3934 includes electrically conductive vias 3936 electrically connected to circuit pattern 2902. The upper exposed surfaces of vias 3936 form lands 3937 of redistribution circuit pattern 3934.

From fill laser-ablated artifacts operation 2830, flow moves to a mount additional structures operation 2832. In mount additional structures operation 2832, additional structures such as an interposer 3938 are mounted to package body 3324 and/or redistribution circuit pattern 3934. Interposer 3938 is electrically connected, e.g., soldered, to redistribution circuit pattern 3934. In one embodiment, interposer 3938 is a structure, e.g., a printed circuit board, to which other structures such as an integrated circuit die are mounted. Interposer 3938 redistributes the pattern of redistribution circuit pattern 3934 to match the footprint of the structure mounted to interposer 3938.

Figure 40:
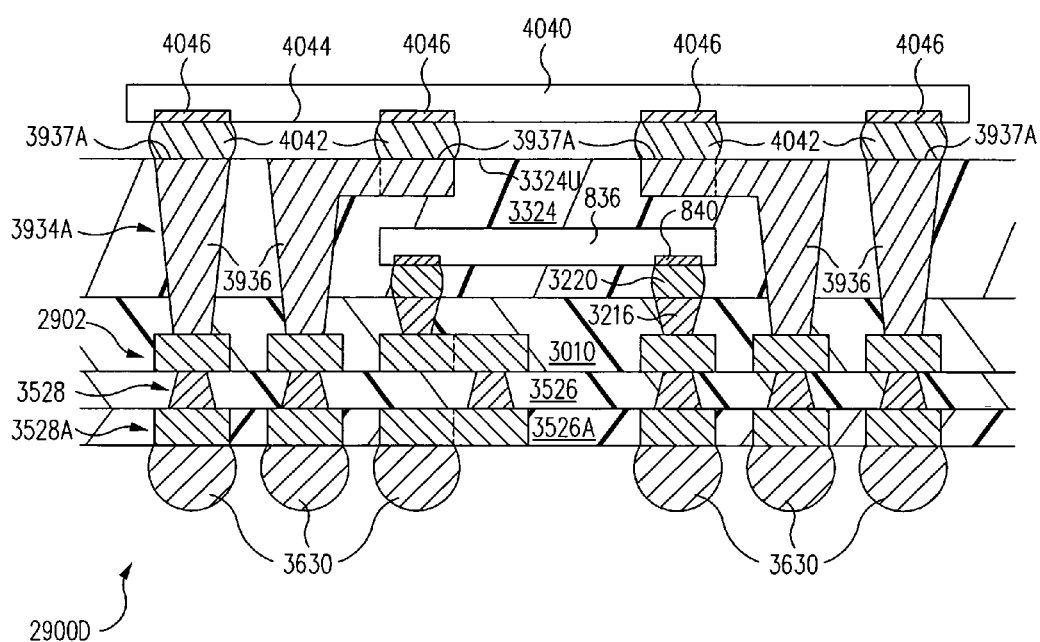

FIG. 40 is a cross-sectional view of a package 2900D in accordance with another embodiment. Package 2900D of FIG. 40 is an example of a chip in substrate (CIS) plus flip chip (FC) package. In another embodiment, package 2900D of FIG. 40 is an example of a chip in substrate (CIS) plus full array LOT for system on package. Package 2900D of FIG. 40 is similar to package 2900C of FIG. 39 and only the significant differences between the packages are discussed below. Referring now to FIGS. 28 and 40 together, performance of form laser-ablated artifacts operation 2826 and fill laser-ablated artifacts operation 2830 forms redistribution circuit pattern 3934A electrically connected to circuit pattern 2902. In accordance with this embodiment, redistribution circuit pattern 3934A includes a plurality of lands 3937A, e.g., distributed as a fully array of lands on upper surface 3324U of package body 3324.

In mount additional structures operation 2832, an electronic structure 4040 is mounted to redistribution circuit pattern 3934A by electrically conductive bumps 4042.

In one embodiment, electronic structure 4040 is die, e.g., an integrated circuit die, having a lower, e.g., first, surface 4044 (e.g., an active surface in this embodiment) with terminals 4046 (e.g., bond pads in this embodiment) formed thereon. Terminals 4046 are physically and electrically flip chip connected to lands 3937A of redistribution circuit pattern 3934A by bumps 4042, e.g., flip chip bumps.

In another embodiment, electronic structure 4040 is electronic component package, e.g., that includes a die, in a package on package (PoP) configuration. In accordance with this embodiment, terminals 4046 are physically and electrically connected to lands 3937A of redistribution circuit pattern 3934A by bumps 4042, e.g., interconnection balls such as ball grid array solder balls.

Figure 41:
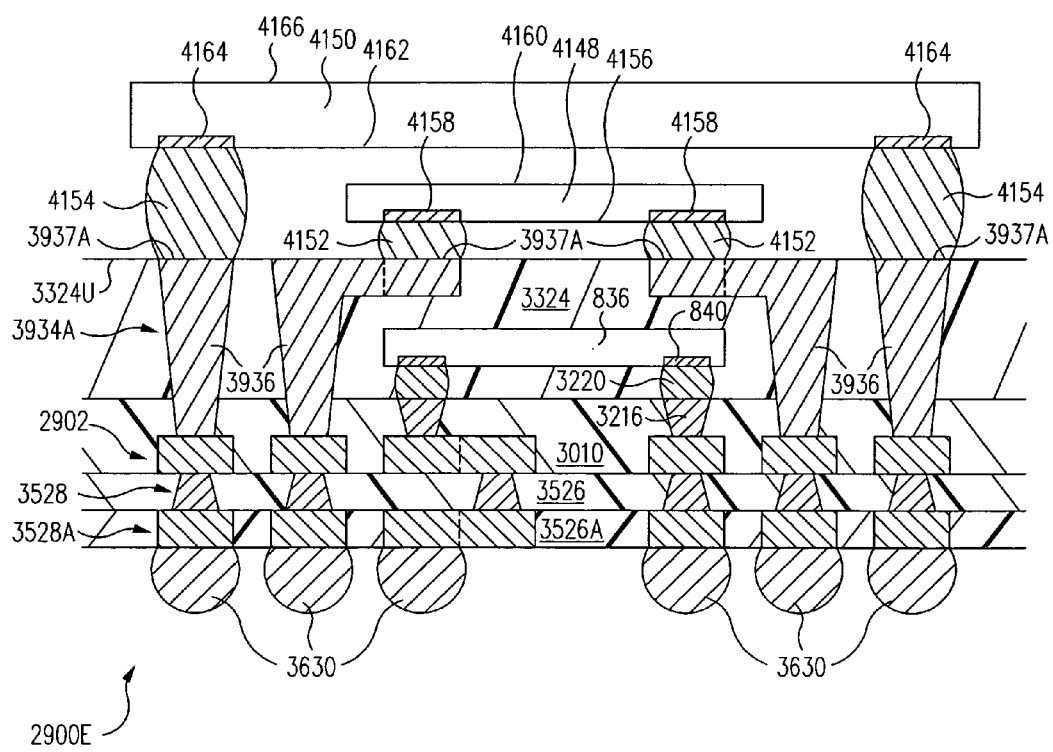

FIG. 41 is a cross-sectional view of a package 2900E in accordance with another embodiment. Package 2900E of FIG. 41 is an example of a chip in substrate (CIS) plus flip chip (FC) plus package on package (PoP) package. Package 2900E of FIG. 41 is similar to package 2900D of FIG. 40 and only the significant differences between the packages are discussed below. Referring now to FIGS. 28 and 41 together, in mount additional structures operation 2832, inner and outer, e.g., first and second, electronic structures 4148, 4150 are mounted to redistribution circuit pattern 3934A by inner and outer, e.g., first and second, electrically conductive bumps 4152, 4154.

In one embodiment, inner electronic structure 4148 is a die or an electronic component package as discussed above in reference to electronic structure 4040. Inner electronic structure 4148 includes a lower, e.g., first, surface 4156 with terminals 4158 formed thereon. Inner electronic structure 4148 further includes an upper, e.g., second, surface 4160 opposite lower surface 4156. Terminals 4158 are physically and electrically connected to lands 3937A of redistribution circuit pattern 3934A by inner electrically conductive bumps 4152.

Outer electronic structure 4150 is a die or an electronic component package as discussed above in reference to electronic structure 4040. Outer electronic structure 4150 includes a lower, e.g., first, surface 4162 with terminals 4164 formed thereon. Outer electronic structure 4150 further includes an upper, e.g., second, surface 4166 opposite lower surface 4162.

Terminals 4164 are physically and electrically connected to lands 3937A of redistribution circuit pattern 3934A by outer electrically conductive bumps 4154. More particularly, outer electrically conductive bumps 4154 space outer electronic structure 4150 above inner electronic structure 4148 as illustrated in FIG. 41 such that lower surface 4162 of outer electronic structure 4150 is above upper surface 4160 of inner electronic structure 4148.

Although formation of individual packages is described above, in other embodiments, a plurality of packages are formed simultaneously in an array using the methods as described above. The array is singulated to singulate the individual packages from one another.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of forming a package comprising:
forming a circuit pattern on a first carrier;
embedding the circuit pattern in a first surface of a dielectric material, a second surface of the dielectric material opposite the first surface being directly mounted on a second carrier, the embedding comprising causing the dielectric material to directly contact the first carrier and the second carrier, wherein the dielectric material remains between the circuit pattern and the second carrier;
removing the first carrier;
mounting a buildup dielectric material to the dielectric material and the circuit pattern;
forming laser-ablated artifacts in the buildup dielectric material;
filling the laser-ablated artifacts with an electrically conductive material to form a buildup circuit pattern; and
subsequent to the embedding, patterning the second carrier into a stiffener.

2. The method of claim 1 further comprising forming bond finger openings in the dielectric material, the bond finger openings exposing and defining lands of the circuit pattern.

3. The method of claim 2 further comprising attaching a die to the dielectric material.

4. The method of claim 3 wherein the attaching a die to the dielectric material comprises attaching an inactive surface of the die to the dielectric material with a die attach adhesive, the die further comprising an active surface comprising bond pads.

5. The method of claim 4 further comprising electrically connecting the bond pads to the lands with bond wires.

6. The method of claim 5 further comprising forming at least one electrically conductive blind via between the circuit pattern and the second carrier.

7. The method of claim 6 wherein the blind via is electrically connected to the stiffener, the stiffener comprising an electrically conductive material.

8. The method of claim 7 wherein the stiffener is connected to a reference voltage source through the blind via.

9. The method of claim 8 wherein the stiffener functions as a reference voltage source ring.

10. The method of claim 9 wherein the electrically connecting the bond pads to the lands with bond wires further comprises electrically connecting one or more of the bond pads to the stiffener with the bond wires.

11. The method of claim 5 further comprising encapsulating the stiffener, the die, the bond wires and an exposed portion of the dielectric material in a package body.

12. The method of claim 1 further comprising forming interconnection balls on the buildup circuit pattern.

13. The method of claim 1 further comprising:
forming bond finger openings in the dielectric material, the bond finger openings exposing and defining lands of the circuit pattern;
attaching an inactive surface of an image sensor die to the dielectric material with a die attach adhesive, the image sensor die further comprising an active surface comprising bond pads and an active area responsive to electromagnetic radiation;
electrically connecting the bond pads to the lands with bond wires; and
attaching a transparent window to the stiffener.

14. The method of claim 1 further comprising:
forming bond finger openings in the dielectric material, the bond finger openings exposing and defining lands of the circuit pattern; and
flip chip die attaching bond pads of a die to the lands with flip chip bumps.

15. The method of claim 7 wherein the electrically conductive material is selected from the group consisting of copper, copper invar copper, copper aluminum copper and copper alloys.

16. A method of forming a package comprising:
forming a circuit pattern on a first carrier;
embedding the circuit pattern in a first surface of a dielectric material, a second surface of the dielectric material opposite the first surface being directly mounted on a second carrier, the embedding comprising causing the dielectric material to directly contact the first carrier and the second carrier, wherein the dielectric material remains between the circuit pattern and the second carrier;
removing the first carrier;
mounting a buildup dielectric material to the dielectric material and the circuit pattern;
forming laser-ablated artifacts in the buildup dielectric material;
filling the laser-ablated artifacts with an electrically conductive material to form a buildup circuit pattern; and
subsequent to the embedding, patterning the second carrier into a stiffener, the stiffener comprising:
a rectangular body around a periphery of the package; and
fingers protruding inwards from the body towards a center of the package.

17. The method of claim 16 wherein the body comprises four sides and four corners.

18. The method of claim 17 wherein one of the fingers protrudes inwards from a middle of each of the sides.

19. The method of claim 18 wherein one of the fingers protrudes inwards from each of the corners.

20. The method of claim 19 wherein the fingers consist of eight fingers.

21. The method of claim 16 wherein each of the fingers extends from the body with a uniform width.

22. A method of forming a package comprising:
forming a circuit pattern on a first carrier;
embedding the circuit pattern in a first surface of a dielectric material, a second surface of the dielectric material opposite the first surface being directly mounted on a second carrier, the embedding comprising causing the dielectric material to directly contact the first carrier and the second carrier, wherein the dielectric material remains between the circuit pattern and the second carrier;
removing the first carrier;
mounting a buildup dielectric material to the dielectric material and the circuit pattern;
forming laser-ablated artifacts in the buildup dielectric material;

filling the laser-ablated artifacts with an electrically conductive material to form a buildup circuit pattern; and
subsequent to the embedding, patterning the second carrier into a stiffener, the stiffener comprising:
  a rectangular body around a periphery of the package; and
  fingers protruding inwards from the body, the fingers comprising:
    a first finger having a uniform width; and
    at least one tapered finger.

23. The method of claim 22 wherein the body comprises:
a first side having the first finger extending from a middle of the first side;
a second side having three of the tapered fingers extending inward therefrom;
a third side having three of the tapered fingers extending inward therefrom; and
a fourth side having an absence of the fingers.

* * * * *